United States Patent
Li et al.

(10) Patent No.: US 12,414,462 B2
(45) Date of Patent: Sep. 9, 2025

(54) ORGANIC SINGLE CRYSTAL COMPOSITE ORIENTED POLYMER MEMBRANE, PREPARATION METHOD THEREFOR, OPTOELECTRONIC DEVICE AND APPLICATION THEREOF

(71) Applicant: Zhejiang University, Hangzhou (CN)

(72) Inventors: Hanying Li, Hangzhou (CN);
Guanxiong Yu, Hangzhou (CN);
Zhixiang Zhong, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/727,633

(22) PCT Filed: Apr. 24, 2023

(86) PCT No.: PCT/CN2023/090336
§ 371 (c)(1),
(2) Date: Jul. 9, 2024

(87) PCT Pub. No.: WO2024/187552
PCT Pub. Date: Sep. 19, 2024

(65) Prior Publication Data
US 2025/0120305 A1    Apr. 10, 2025

(30) Foreign Application Priority Data

Mar. 16, 2023 (CN) ......................... 202310256385.7

(51) Int. Cl.
*C30B 29/54* (2006.01)
*C30B 7/00* (2006.01)
(Continued)

(52) U.S. Cl.
CPC ............. *H10K 85/623* (2023.02); *C30B 7/00* (2013.01); *C30B 29/54* (2013.01); *C30B 29/62* (2013.01);
(Continued)

(58) Field of Classification Search
CPC ......... C30B 29/54; C30B 29/66; C30B 29/62; C30B 7/00
See application file for complete search history.

(56) References Cited

U.S. PATENT DOCUMENTS

| 5,180,470 A * | 1/1993 | Smith | ............ C30B 29/54 |
| 2015/0194606 A1 * | 7/2015 | Luo | ............ H10K 71/191 257/40 |
| 2022/0173340 A1 | 6/2022 | Li et al. | |

FOREIGN PATENT DOCUMENTS

| CN | 101953795 A * | 1/2011 | .......... A61B 5/0515 |
| CN | 113439347 A | 9/2021 | |

(Continued)

*Primary Examiner* — Matthew J Song
(74) *Attorney, Agent, or Firm* — MUNCY, GEISSLER, OLDS & LOWE, P.C.

(57) ABSTRACT

An organic single crystal composite oriented polymer membrane, a preparation method therefor, an optoelectronic device and an application thereof are provided. The composite membrane includes oriented polymers and organic single crystals. The oriented polymers are polymer fibers in which organic polymers are arranged in a single direction. The organic single crystals tightly wrap the polymer fibers. The invention further provides a preparation method for composite membrane, which includes preparing an oriented polymer membrane through spatial confinement method and directional crystallization method, and growing an organic single crystal on the oriented polymer membrane by solution method. The composite membrane prepared by the method provided by the invention takes into account a large interface area of a heterojunction of a bulk heterojunction and long- (Continued)

range ordering, and achieves high carrier mobility and long exciton diffusion distance while ensuring efficient dissociation of excitons.

38 Claims, 11 Drawing Sheets

(51) Int. Cl.
  *C30B 29/62* (2006.01)
  *C30B 29/66* (2006.01)
  *H10K 85/10* (2023.01)
  *H10K 85/20* (2023.01)
  *H10K 85/40* (2023.01)
  *H10K 85/60* (2023.01)

(52) U.S. Cl.
  CPC ............ *C30B 29/66* (2013.01); *H10K 85/113* (2023.02); *H10K 85/211* (2023.02); *H10K 85/40* (2023.02); *H10K 85/6576* (2023.02)

(56) References Cited

FOREIGN PATENT DOCUMENTS

| | | |
|---|---|---|
| CN | 113439347 B | 1/2022 |
| JP | 2005277102 A | 10/2005 |
| WO | 2021037274 A1 | 3/2021 |

\* cited by examiner

ORGANIC SINGLE CRYSTAL COMPOSITE ORIENTED POLYMER MEMBRANE, PREPARATION METHOD THEREFOR, OPTOELECTRONIC DEVICE AND APPLICATION THEREOF

BACKGROUND OF THE INVENTION

Field of the Invention

The invention belongs to the technical field of organic semiconductors, in particular, to an organic single crystal composite oriented polymer membrane, a preparation method therefor, an optoelectronic device and an application thereof.

Description of the Related Art

Organic semiconductor heterojunction is a composite structure formed by the contact of two or more organic semiconductor materials. The organic semiconductor heterojunction not only combines the electrical and optical properties of different organic semiconductors, but can even achieve properties that single-component organic semiconductors do not have. For example, a built-in electric field will be formed at the heterogeneous interface, which greatly improves the dissociation efficiency of photogenerated excitons, so that the performance of heterojunction-based optoelectronic devices (such as solar cells, photodetectors, etc.) is much higher than that of single-component organic semiconductor optoelectronic devices. However, the performance of optoelectronic devices is also limited by the diffusion distance of excitons and the migration ability of carriers; for example, in a planar heterojunction composed of Copper (II) phthalocyanine (CuPc) and benzimidazole perylene (PTCBI), since the diffusion distance of excitons of CuPc is only 10-50 nm, excitons that fail to diffuse to the heterojunction interface will recombine again, so that the short-circuit current is only about half of that of bulk heterojunction devices (F. Yang, M. Shtein, S. R. Forrest, Nature Materials, 4, 37 (2005)). In addition, the dissociated carriers may also be captured by defects in the system, which also leads to a decrease in the efficiency of the devices (H. Li, C. Fan, and W. Fu, AngewandteChemie International Edition, 54, 956 (2015)). Therefore, an ideal high-performance optoelectronic device requires a large contact area for the heterojunctions, high carrier mobility, and long diffusion distance of the excitons.

In order to achieve a larger contact area for the heterojunctions, organic optoelectronic devices often adopt bulk heterojunction structures. The bulk heterojunction means that holes and electron transport materials (i.e., donor and acceptor) are mixed in the entire area and the interface between the two is spread throughout the area. Since a depletion layer will be formed to generate a built-in electric field when the holes and electron transport materials are in close contact, and the photogenerated excitons of organic semiconductors need to be dissociated into free charges with the help of the built-in electric field, the bulk heterojunction can increase the number of photogenerated excitons that reach the interface and dissociate within a limited diffusion distance, thereby improving the overall optoelectronic performance of the device, such as short-circuit current, photoresponsivity, etc.

Currently, commonly used methods for preparing organic semiconductor bulk heterojunctions include spin coating the blended solution and vapor phase co-deposition, which tend to form a bulk heterojunction morphologywithrandomly separate donor and acceptor phases. However, the random phase separation often produces structures that are detrimental to the carrier migration. For example, carriers generated within an island structure, in which one phase is completely surrounded by another, would not be able to be extracted by the electrode. Besides, the structures obtained by these two methods are often amorphous or polycrystalline, with many structural defects. The defects in the structure could be served as traps to trapcarriers and excitons, as well as scatter carriers and excitons to hinder their migration, thereby reducing the number of charges collected by the electrode and reducing photovoltaic conversion efficiency and other properties.

In order to achieve high mobility of carriers and diffusion distance of excitons, the organic optoelectronic devices require long-range ordered structures. The most ideal long-range ordered structure is a structure in which the lattice is arranged periodically and has no grain boundaries, i.e., a single crystal. There are fewer defects in single crystals, which is more conducive to the excitondiffusion and carriermigration, as compared with amorphous and polycrystalline materials, and further increases the number of excitons that migrate to the interface and the number of carriers collected by the electrode, which is reflected in the improvement of the performance of optoelectronic devices, such as the mobility of carriers.

Currently, methods for preparing small-molecule organic semiconductor single crystals include anti-solvent diffusion method, solvent evaporation method, cooling precipitation method, etc. However, the crystals obtained by these methods are often in the shape of a bulk with a large thickness, wherein the carriers cannot migrate to the electrode in a given period during their lifetime, and the recombination phenomenon of photogenerated carriers is serious, which restricts the improvement of the performance of related optoelectronic devices. The meniscus coating method, the printing method, etc. (G. Giri, E. Verploegen, and S. C. B. Mannsfeld, Nature, 480, 504 (2011); H. Minemawari, T. Yamada, and H. Matsui, Nature, 475, 364 (2011)) can achieve the growth of thin-membrane-like single crystals on the substrate. However, in order to increase the area of the heterojunction interface, it is necessary to grow crystals on the uneven surface of the substrate, and undulations exceeding the thickness of the crystal will hinder the progress of crystallization while the rough surface increases nucleation sites, sometimes only obtain polycrystals (W. Shao, H. Dong and W. Hu, Chemical Science, 2, 590 (2011)).

For polymer organic semiconductors, since the crystallization process involves multiple chain conformational transitions, there are multiple barriers and even difficult to obtain single crystals (J. A. Lim, F. Liu, and S. Ferdous, Materials Today, 13,14 (2010)). Currently, attempts to construct long-range ordered organic polymer semiconductors focus on forming oriented structures, including solution shearing methods, mechanical friction methods, etc. However, in the solution shearing method, the polymer nucleates at the air-liquid interface, and the resulting polymer membrane only has obvious orientation on the surface, with the side close to the substrate being almost isotropic (D. Wu, M. Kaplan, and H. W. Ro, Chemistry of Materials. 30, 1924 (2018)). The mechanical rubbing method not only requires repeated rubbing with specially designed instruments, but also relies on highly-oriented polytetrafluoroethylene (PTFE) as a substrate to induce the orientation of organic polymer semiconductors, which requires high operational requirements (L. Biniek, S. Pouget, and D. Djurado, Macromolecules, 47, 3871 (2014)). After the polymer is oriented, oriented undulations will be formed on the surface, and the surface roughness will also increase, so that during the subsequent growth of thin-membrane-like small-molecule single crystals, the edges of the solution droplets shrink unevenly; further, high roughness promotes local nucleation and is not conducive to the formation of single crystals and the directional growth of single crystal arrays.

As mentioned above, current organic semiconductor optoelectronic devices can only take into account one of large contact area for heterojunctions and long-range ordering, but cannot take into account the above two properties. Due to the self-regulatory nature of single crystals, single crystals tend to form regular convex polyhedral morphologies to minimize system energy and are not easily embedded in another phase to form uneven surfaces; therefore, it is difficult to achieve a structure that combines large interface area and long-range ordering in bulk heterojunctions. A feasible way is to orient two organic semiconductor polymers together in a blended solution to form a bulk heterojunction, but the oriented polymer semiconductor has grain boundaries, and the long-range ordering is not as good as that of a single crystal; on the other hand, small-molecule single crystal membranes are usually composed of strip-shaped crystals with micron-scale widths, resulting in the heterojunction formed by the two small-molecule single crystals being a planar heterojunction, with limited interface area, so that the photogenerated excitons cannot fully diffuse to the interface for dissociation. Thus, the composite structure of small-molecule single crystals and oriented polymers can form a large contact area for heterojunctions while ensuring the long-range ordering of the system to the maximum extent, in order to achieve excellent optoelectronic properties.

There have been some attempts to construct long-range ordered bulk heterojunctions between organic small-molecule single crystals and polymer semiconductors. A literature (J. Ren, S. Meng, and X. Guo, Journal of the American Chemical Society, 142, 1630 (2020)) was inspired by the phenomenon of biomineralization where crystals can be embedded in organogel fibers, and C60 crystals were grown in poly[2-methoxy-5-(2'-ethylhexyloxy)-1,4-phenylene vinylene] (MEH-PPV) gel, so that the MEH-PPV gel fibers were evenly embedded inside the obtained crystal, while the C60 crystal still maintained long-range ordering. However, the long-range ordered bulk heterojunction constructed by this method has limited guest embedded content, mostly below 1 wt %; the obtained C60 crystal has a three-dimensional hexagonal bipyramidal shape of about 100 μm, so that when the device is constructed, electrodes can only be evaporated randomly at certain positions on the crystal through a mask, which is highly uncontrollable and inconvenient to operate. According to the literature (H. Li, G. Xue, and J. Wu, Chinese Chemical Letters, 28, 2121 (2017)), fibers of perylene bisimide (PBI) derivatives were dispersed on the substrate in advance, and then a single crystal array of 6,13-bis(triisopropylsilylethynyl)-pentacene (Tips-pentacene) was grown on it using droplet-pinned crystallization (DPC) method, wherein the single crystal adheres to the fibers to grow undulatingly to form a larger contact area, forming a long-range ordered bulk heterojunction. However, since PBI fibers are randomly dispersed on the substrate through spin coating, undulations on their surface are small and uniform, and have little impact on subsequent Tips-pentacene crystal growth. The fibers produced in this way have no obvious orientation. In addition, the PBI fibers used in the literature have poor crystallinity. The long-range ordering of the system can be further improved by selecting crystalline polymer semiconductors and orienting them.

In summary, the prior art cannot produce long-range ordered bulk heterojunction membranes as mentioned above because there are mainly four challenges: 1) the crystallization process for polymers is complex and involves multiple chain conformational transformations, and it is difficult to easily achieve better orientation with existing methods for preparing oriented polymer organic semiconductors; 2) oriented polymer organic semiconductors are composed of fibers with different thicknesses and diameters, wherein the surface is rough and the undulations exceeding the thickness of the crystal will hinder the growth of single crystals, and further the rough surface increases nucleation sites and makes the crystals tend to form polycrystals; 3) the self-regulatory nature of single crystals causes the single crystals to tend to form regular convex polyhedral morphologies to minimize system energy and makes it difficult for the single crystals to form uneven surfaces for embedding the polymer fibers; 4) there are requirements for the selection of growth systems and solvents, and it is necessary to ensure that the solvent used in the subsequent solution method to grow single crystals will not dissolve the pre-dispersed oriented fibers on the substrate. Therefore, how to obtain an ideal long-range ordered bulk heterojunction membrane composed of an ideal small-molecule organic semiconductor single crystal and an oriented polymer organic semiconductor is a huge technical problem and a huge obstacle to the realization of high-performance organic optoelectronic devices.

SUMMARY OF THE INVENTION

In view of the drawbacks in the prior art, the invention provides an organic single crystal composite oriented polymer membrane, a preparation method therefor, an optoelectronic device and an application thereof. The heterojunction formed by the organic single crystal composite oriented polymer according to the invention takes into account a large interface area of a heterojunction of a bulk heterojunction and long-range ordering, and achieves high carrier mobility and long exciton diffusion distance while ensuring efficient dissociation of excitons. With the composite membrane prepared by the method provided by the invention, a fluorescence lifetime of the long-range ordered bulk heterojunction of the invention is reduced by 81% as compared with the short-range ordered bulk heterojunction obtained by spin coating method; compared with the bulk heterojunction formed by the organic single crystal composite disordered polymer semiconductor, the invention further increases the long-range ordering of the system by orienting the polymer, and reduces the fluorescence lifetime by 27%, which indicates that the structure of the organic single crystal composite oriented polymer semiconductor thin membrane has the potential to improve the performance of optoelectronic devices.

In order to achieve the foregoing objectives, technical solutions of the invention are:

An organic single crystal composite oriented polymer membrane includes an oriented polymer and an organic single crystal, wherein the oriented polymer is composed of polymer fibers in which organic polymers are arranged and grown in a single direction; the polymer fibers are of different lengths and arranged in the same orientation, and organic polymer molecular chains are also arranged in a fixed crystalline aggregation, because the principle of the growth of the polymer fiber is that the organic molecular chains first form a fiber morphology through crystallization, and then the fibers grow in alignment in the same direction, but the direction of arrangement and growth of the fibers may be the same as or different from the direction of the molecular chains; and the organic single crystal tightly wraps the polymer fiber.

Further, the tight wrapping means that an organic semiconductor single crystal adheres to a surface of the polymer fiber for growth, forming the single crystal.

Further, a detection method for the tightly wrapping is to observe whether a surface micromorphology of the organic single crystal is undulating, and to observe whether there are indentations on a bonding surface between the organic single crystal and the oriented polymer; the indentation refers to a small width (usually no more than 100 nm) in which a sample height decreases relative to an edge position of this width range, and the sample height on both sides of this width range is almost the same.

Further, the detection method for the tightly wrapping is to measure a depth of the indentation on the bonding surface between the organic single crystal and the oriented polymer, and the depth of the indentation is a height difference between the lowest position of the indentation and an edge of the indentation; if the polymer fiber is not embedded with the organic single crystal, then a bottom surface of the organic single crystal should be flat or have only growth steps, and there should be no indentations, i.e., the depth of the indentation is 0 nm. Therefore, 10 indentations on the bonding surface of the organic single crystal and the oriented polymer may be randomly selected to measure an average depth of the indentations.

Further, the depth of the indentation is greater than or equal to 5 nm, which may indicate that the organic single crystal and the oriented polymer adhere closely together for growth.

A method of preparing a sample of the bonding surface between the organic single crystal and the oriented polymer may be spin-coating a polyvinyl alcohol aqueous solution on an upper surface of the organic single crystal composite oriented polymer membrane at a rotation speed of 2000 rpm for 30 s, and peeling off the polyvinyl alcohol after drying to expose the bonding surface.

The organic single crystal is a single crystal of an organic semiconductor grown on the polymer fiber, and the organic semiconductor in the invention is an organic semiconductor molecule with a clear and fixed molecular formula, molecular structure and molecular weight. Preferably, the organic semiconductor is selected from one or more of linear benzo compounds and derivatives thereof, linear heterobenzo compounds and derivatives thereof, benzothiophene compounds and derivatives thereof, perylene and derivatives thereof, and fullerene and derivatives thereof.

Further, the organic semiconductor is 6,13-bis(triisopropylsilylethynyl)-pentacene (Tips-pentacene), 6,13-bis-(triisopropylsilylethynyl)-5,7,12,14-tetraazapentacene (Tips-TAP) or 2,7-dioctyl[1]benzothieno[3,2-b][1]-benzothiophene (C8-BTBT), or fullerene (C60) or perylene. The derivative refers to a substance formed by replacing certain atoms or atomic groups in a compound molecule with other atoms or atomic groups. For example, Tips-pentacene is a derivative of pentacene.

In the invention, the organic polymer grown as the oriented polymer is an organic semiconductor molecule connected by a series of monomer units and having a certain molecular weight distribution. Preferably, the organic polymer is a linear conjugated homopolymer, a donor-acceptor alternating copolymer, or a polymer formed by polymerization of small-molecule organic semiconductors. The small-molecule organic semiconductor usually refers to a small molecule with a molecular weight less than 1000 and a clear molecular weight and structural formula, e.g., 2,2'-((2Z,2'Z)-((4,4,9,9-tetrahexyl-4,9-dihydro-s-indaceno[1,2-b:5,6-b']dithiophene-2,7-diyl)bis(methanylylidene))bis(3-oxo-2,3-dihydro-1H-indene-2,1-diylidene))dimalononitrile (IDIC), (2,2'-((2Z,2'Z)-((12,13-bis(2-ethylhexyl)-3,9-diundecyl-12,13-dihydro[1,2,5]thiadiazolo[3,4e]thieno[2",3":4',5']thieno[2',3':4,5]pyrrolo[3,2-g]thieno[2',3':4,5]thieno[3,2-b]indole-2,10-diyl)bis(methanylylidene))bis(3-oxo-2,3-dihydro1H-indene-2,1-diylidene))dimalononitrile) (Y5), (2,2'-((2Z,2'Z)-((12,13-bis(2-ethylhexyl)-3,9-diundecyl-12,13-dihydro[1,2,5]thiadiazolo[3,4e]thieno[2",3":4',5']thieno[2',3':4,5]pyrrolo[3,2-g]thieno[2',3':4,5]thieno[3,2-b]indole-2,10-diyl)bis(methanylylidene))bis(3-oxo-2,3-dihydro1H-indene-2,1-diylidene))dimalononitrile) (Y6), etc., which are directly or connected through conjugated connecting units, such as carbon-carbon double bonds, thiophene rings, etc.; the polymer formed by the polymerization of the small-molecule organic semiconductors includes PZ1 (poly[(2,2'-((2Z,2'Z)-((4,4,9,9-tetrahexadecyl-4,9-dihydro-s-indaceno[1,2-b:5,6-b']dithiophene-2,7-diyl)bis-(methanylylidene))bis(3-oxo-2,3-dihydro-1H-indene-2,1-diylidene)) dimalononitrile-alt-2,5-thiophene)]), PY-1T (poly[(2,2'-((2Z,2'Z)-((4,4,9,9-tetrahexadecyl-4,9-dihydro-s-indaceno[1,2-b:5,6-b']dithiophene-2,7-diyl)bis-(methanylylidene)) bis(3-oxo-2,3-dihydro-1H-indene-2,1-diylidene)) dimalononitrile-alt-2,5-thiophene)]), etc.

Preferably, the organic polymer is Poly[(2,6-(4,8-bis(5-(2-ethylhexyl-3-fluoro)thiophen-2-yl)-benzo[1,2-b:4,5-b'] dithiophene))-alt-(5,5-(1',3'-di-2-thienyl-5',7'-bis(2-ethylhexyl)benzo[1',2'-c:4',5'-c']dithiophene-4,8-dione)] (PM6), PY-1T, etc.

Preferably, the organic single crystal composite oriented polymer membrane further includes a substrate, wherein the oriented polymer is arranged and grown in a single direction on the substrate.

The substrate may be a hard substrate, such as glass, silicon wafer, metal oxide (AlOX, ITO, FTO), or may be a flexible substrate, such as polyimide (PI), polyethylene terephthalate (PET), mica sheets, etc.; the substrate should not be dissolved or corroded by the solvent used in the preparation process.

In order to facilitate the subsequent growth of the organic single crystal, the substrate may be modified; preferably, the substrate is a substrate modified with a self-assembled molecule containing a silane group, a self-assembled molecule containing a phosphate group or a self-assembled molecule containing a thiol group.

Preferably, the substrate is a substrate modified with cross-linked poly(methylmethacrylate) (c-PMMA) or benzocyclobutene (divinyltetramethyldisiloxane-bis (benzocyclobutene) (BCB).

The invention further provides a simple preparation method for oriented polymer membrane, wherein with the help of the directional crystallization process of organic solvents that are solid at room temperature, the polymer solute is squeezed into a thin layer of space to restrict crystallization, and the one-dimensional orientation of the polymer is further achieved on the substrate through the flow field during the solidification process. Here, the substrate may be a substrate in a narrow sense, and the substrate may be just a hard substrate such as glass, silicon wafer, metal oxide ($AlO_X$, ITO, FTO), or a flexible substrate such as polyimide (PI), polyethylene terephthalate (PET), mica flakes, etc.; the substrate may be modified by a self-assembled molecule containing silane groups, a self-assembled molecule containing phosphate groups, or a self-assembled molecule containing thiol groups; The substrate may also be a substrate in a broad sense; that is to say, when applied to the semiconductor device, it may have electrodes and a transport layer as the substrate, and polymer fibers are oriented and grown on the transport layer. Compared with the solution shearing method and the mechanical rubbing method, the oriented polymer membrane prepared by the invention has good orientation throughout the thickness range, does not require multiple operations with a specific mold, and is widely applicable to a variety of substrates.

The spatial confinement and directional crystallization method is used to prepare the oriented polymer membrane by entire apparatuses including a motor, a screw, a ball nut, a fixture, and a temperature gradient hot stage. An output shaft of the motor is connected with the screw, and the screw is in threaded connection with the ball nut. The fixture is used to clamp the substrate, and the temperature gradient hot stage is arranged parallel to the screw. The fixture is fixedly connected with the ball nut, and the fixture is placed on the temperature gradient hot stage. The motor drives the screw to rotate, and then the ball nut moves on the screw, which drives the fixture to move from a high temperature area to a low temperature area on the temperature gradient hot stage, i.e., the substrate moving from the high temperature area to the low temperature area; therefore, a moving speed of the fixture is equal to a moving speed of the substrate, which is equal to a solidification speed of the organic polymer in the organic polymer solution. The temperature gradient hot stage may be a Kofler melting point apparatus. The substrate is placed on the temperature gradient hot stage. A size of the substrate should not exceed a size of the hot stage, and preferably, is a square with a side length of 1-1.5 cm.

The specific operations are: a required mass of the organic polymer and an organic solvent that is solid at room temperature are weighed, and heated to melt the organic solvent to form an organic polymer solution, wherein a heating temperature of the organic solvent is between a melting point and a boiling point of the organic solvent. Subsequently, the substrate is placed on the temperature gradient hot stage equipped with the fixture, the organic polymer solution is taken and dropped dropwise onto the substrate, and a solution droplet is quickly covered with another clean glass sheet (or other coverings while choosing a transparent glass piece to easily observe the solidification of the solvent) that has been preheated on a hot stage above the melting point of the organic solvent. A surface of the glass sheet in contact with the organic polymer solution is preferably modified with octadecyltrichlorosilane (OTS). The purpose of modification of the glass sheet is to easily remove the glass sheet after the solvent and organic polymer solidify without adhering to the oriented polymer, leaving the intact membrane on the substrate. A temperature of an initial placement position of the substrate is not lower than the melting point of the organic solvent used. Then, items pre-cooled at low temperature (such as tweezers heads, needles, etc.) are touched to the surface of the glass sheet covering the substrate at a low-temperature side of the hot stage, so that a temperature gradient is formed in a vertical direction from the substrate to the glass sheet covered above, and the organic solvent in the liquid membrane nucleates and grows on the surface of the glass sheet above under induction of low temperature. Once nucleation of the solvent is observed, the precooled items used to induce nucleation may be removed. Preferably, the glass sheet may be pressed with a weight of m≥100 g to reduce a thickness of the liquid membrane sandwiched between the glass sheet and the substrate, so that a thickness and a roughness of the obtained polymer membrane become smaller, and the spatial confinement effect is increased, which is beneficial to the formation of the orientation structure and the subsequent growth of the organic single crystal.

Then, the motor is initiated, and the screw rotates to drive the ball nut to move, so that the fixture moves the substrate with the substrate to the low-temperature area of the temperature gradient hot stage at a constant rate. During the growth process of organic solvent crystals, organic polymer solutes will be continuously squeezed out and enriched in a very thin thickness range close to the substrate surface, and directional movement on the temperature gradient hot stage leads to directional crystallization of the organic solvent, so that the polymer exhibits a decreasing concentration gradient from the low temperature area to the high temperature area of the temperature gradient hot stage. Therefore, under the combined action of the spatial confinement effect and the concentration gradient, the organic polymer gradually crystallizes and precipitates with the directional crystallization of the organic solvent from high to low temperature areas, until the liquid membrane is completely solidified, and finally, a polymer semiconductor membrane with a single direction orientation is obtained. Preferably, the moving speed of controlling the fixture by the motor is 5-800 μm/s, that is, the moving speed of the substrate is preferably 5-800 μm/s.

Then, the glass sheet is peeled off and the solidified liquid membrane is placed in an environment lower than the melting point of the organic solvent or in a vacuum to sublimate the organic solvent, or an orthogonal solvent is used to remove the solid organic solvent, i.e., the oriented polymer membrane is obtained on the substrate. The orthogonal solvent refers to a solvent that dissolves the solid organic solvent but does not dissolve the organic polymer to be prepared.

The low-temperature pre-cooling is a relative concept, which is generally lower than the melting point of the organic solvent. If the difference between the melting point of the organic solvent and the melting point of the organic solvent is above 80° C., it can be considered that the item is pre-cooled at low temperature.

Modifying the glass sheet by OTS has the following specific operations: in a nitrogen atmosphere glove box, a pipette is used to pipette 8 μL of OTS, which is injected into a sample bottle containing 20 mL of m-xylene, and flushed several times to completely transfer the OTS. The sample bottle is capped, shaken well, and removed from the glove box. After the glass sheet is cleaned with alkali solution, it is treated with plasma at 10% power for 120 s. The processed glass sheet is placed in a PTFE petri dish, the prepared OTS solution is poured, and then the cover is covered for standing for 1-2 hours in an atmospheric environment. After the reaction is completed, the OTS-modified glass sheet is obtained by ultrasonic cleaning with chloroform.

The organic polymer is an organic semiconductor molecule connected by a series of monomer units and having a certain molecular weight distribution. Preferably, the organic polymer is a linear conjugated homopolymer, a donor-acceptor alternating copolymer, or a polymer formed by polymerization of small-molecule organic semiconductors.

Preferably, the organic polymer is poly(3-hexylthiophene-2,5-diyl) (P3HT), PM6, PY-1T, etc.

Based on the same inventive concept, the invention further provides a preparation method for the above organic single crystal composite oriented polymer membrane, which includes steps of:

S1: preparing an oriented polymer membrane on a substrate through the above spatial confinement and directional crystallization method, wherein a concentration of an organic polymer solution is c; in order to avoid a larger roughness of the pre-dispersed oriented polymer fibers at the bottom and higher protrusions hindering the growth of the single crystal, in addition to the above thinning of the liquid membrane by the weight, the concentration of the polymer solution is preferably $0<c\leq5$ mg/mL, and further preferably, $2\leq c\leq4$ mg/mL;

S2: growing an organic single crystal on the oriented polymer.

In order to achieve the growth of the organic single crystal membrane on rough surfaces, the substrate should be properly selected and modified to nucleate the single crystal at a gas-liquid interface, so that the crystal may grow across the bottom obstacle into a continuous single crystal. Further, since the organic single crystal has a certain degree of flexibility, the single crystal grown at the air-liquid interface may partially adhere to the undulations of the bottom surface, and continue to fill a gap between the single crystal and fibers at the bottom as the solution evaporates, achieving close contact between the above two. Due to the directional arrangement of the polymer fibers on the substrate, the shrinkage of the droplets along the vertically oriented direction is hindered to a certain extent; therefore, relatively continuous organic single crystals are usually obtained in the direction parallel to the oriented direction of the underlying polymer. The substrate may be a hard substrate, such as glass, silicon wafer, metal oxide ($AlO_x$, ITO, FTO), or may be a flexible substrate, such as polyimide (PI), polyethylene terephthalate (PET), mica sheets, etc.; the substrate should not be dissolved or corroded by the solvent used in the preparation process, and may be modified for better subsequent growth of the single crystal on the oriented polymer. A material for the modification of the substrate is a thin membrane material, such as any one or more of silane group-containing self-assembled molecules, phosphate group-containing self-assembled molecules, and thiol group-containing self-assembled molecules. Further, preferably, the modification is performed by BCB and c-PMMA.

The modifying the substrate by c-PMMA specifically includes: heating and dissolving PMMA with n-butyl acetate at 90° C., preparing a solution of 25 mg/mL, and then cooling for later use; adding a cross-linking agent 1,6-bis (trichlorosilyl) hexane to the n-butyl acetate solution of PMMA (adding 20 µL cross-linking agent per ml of the solution) for later use; placing the substrate on a spin coater, turning on a vacuum pump to adsorb the substrate, dripping the solution onto the substrate surface until the surface is completely covered, spin-coating at a speed of 4000 rpm for 30 s, and then performing thermal treatment at 100° C. for 1 h in a nitrogen atmosphere to complete cross-linking.

The modifying the substrate by BCB specifically includes: treating the substrate treated with a plasma at 10% power for 120 s and transferring it to a glove box in a nitrogen atmosphere; diluting a stock solution of a BCB-propolymer with mesitylene (with a volume ratio of 1:30) and mixing thoroughly, then filtering with a filter membrane with a pore size of 220 nm for future use; placing the plasma-hydrophilized substrate on a spin coater, dripping a mesitylene solution of the BCBpropolymer onto the substrate surface until the surface is completely covered, and spin-coating at 4000 rpm for 30 s and then performing thermal treatment for cross-linking in a nitrogen atmosphere with conditions of 123° C., 185° C., and 247° C. for 30 min.

Further, in the step S2, the organic single crystal is grown on the oriented polymer through a solution method.

Further, the growing the organic single crystal through a solution method specifically includes:

S201: first, dissolving an organic semiconductor in a solvent to prepare an organic semiconductor solution;

S202: growing the organic single crystal on the oriented polymer by any one of a droplet-pinned crystallization method and modifications thereof and a meniscus coating method.

Further, the growing the single crystal by a droplet-pinned crystallization method specifically includes:

S202: placing a substrate on which the oriented polymer has been prepared in a container, preferably placing the substrate on which the oriented polymer has been prepared on a coverslip, and then placing the coverslip in a petri dish; and placing a pinnerat the center of the substrate on which the oriented polymer has been prepared, preheating the entire container, and dropping the organic semiconductor solution onto the pinner at the preheating temperature and quickly sealing the container (be careful not to shake the container when sealing to prevent the position of the droplet from moving), so as to obtain the organic single crystal after the solvent in the droplet has completely evaporated.

Specifically, the step includes: in a clean room, placing the substrate on which the oriented polymer has been prepared on a cover slip, placing the cover slip in a petri dish, and placing a pinner in the center of the substrate; placing the whole on the hot stage to preheat for 5-10 minutes to allow the temperature to reach equilibrium, and using a pipette to absorb 15-25 µL of the solution containing the organic semiconductor under the preheating temperature for dripping onto the pinner, and quickly covering a lid of the Petri dish; be careful not to shake the Petri dish when sealing to prevent the position of the droplet from shifting; obtaining an organic small-molecule single crystal when the solvent in the droplet has completely evaporated after 5-30 minutes.

Further, the pinner is a silicon wafer, a needle, or a metal rod.

Further, a size of the silicon wafer is 3×3 mm².

Further, the modification of the droplet-pinned crystallization method is placing the substrate on which the oriented polymer has been prepared in a container and tilting the substrate by 0.1-5°, preheating the entire container, and then dropping the organic semiconductor solution onto the pinner under the preheating temperature and quickly sealing the container, so as to obtain the organic single crystal after the solvent in the droplet has completely evaporated.

Further, the growing the organic single crystal by a meniscus coating method specifically includes: adjusting a distance between a coating tool and the substrate on which the oriented polymer has been prepared to 100-150 µm, then preheating the substrate on which the oriented polymer has been prepared for 10 minutes and injecting the organic semiconductor solution into a gap between the coating tool and the substrate, and then making the coating tool move parallel to the substrate at a constant speed to shear the organic semiconductor solution and absorbing the excess organic semiconductor solution to prevent reflow from dissolving grown crystals after the coating is completed; or dipping the substrate on which the oriented polymer has been prepared into the organic semiconductor solution, and lifting the substrate upward to form a meniscus between the lifted substrate and the organic semiconductor solution until the substrate is completely separated from the organic semiconductor solution.

Further, the coating tool is a scraper, a blade, a smooth rod, a coil rod, a brush, or a bead.

Further, the coating tool moves at a speed of 10-800 µm/s.

In the step S201, the selection of solvent for dissolving the organic semiconductor should consider the evaporation rate at a given temperature, solubility to the organic semiconductor, and solubility to the oriented polymer organic semiconductor that has been dispersed on the substrate. Preferably, a solubility of organic semiconductor in the solvent is greater than 0.2 mg/mL, and the solvent does not dissolve the oriented polymer at an operating temperature.

Further, the solvent is one or a mixture of n-hexane, n-heptane, m-xylene or 4-methyl-2-pentanone.

A concentration of the organic semiconductor solution is 0.1-0.8 mg/mL, preferably 0.2-0.6 mg/mL.

If different solvents are used to dissolve the organic semiconductor, the preheating temperatures for the substrate are different; for example, if n-hexane is used, the preheating temperature is 20-28° C.; if n-heptane is used, the preheating temperature is 36-40° C.; if m-xylene or p-xylene is used, the preheating temperature is 40-50° C. For n-hexane, the preheating temperature may also be 4-6° C., but the Petri dish does not need to be sealed with a sealing film. As the most preferred, Tips-pentacene is a 0.4 mg/mL n-hexane solution, and the preheating temperature is 25° C.; Tips-TAP is a 0.3 mg/mL n-hexane solution, and the preheating temperature is 25° C.

The invention further provides an optoelectronic device, which includes the organic single crystal composite oriented polymer membrane according to the above or the organic single crystal composite oriented polymer membrane prepared by the method for organic single crystal composite oriented polymer membrane according to the above.

Preferably, the optoelectronic device is selected from a solar cell, a photodetector, a light emitting diode or a light emitting field effect transistor.

Preferably, the photodetector is a photosensitive resistor and a photosensitive field effect transistor.

Preferably, the optoelectronic device further includes an electrode and a transport layer according to actual device structure requirements; the electrode and the transport layer may be pre-prepared on the substrate, and then a composite membrane may be prepared on the transport layer; a composite membrane may also be prepared directly on the substrate, and the electrode and the transport layer may be prepared on the composite membrane.

Preferably, a preparation method for the electrode is one of vacuum evaporation, sputtering, and subsequent transfer.

Preferably, a material of the electrode is selected from one or a combination of gold, aluminum, silver, and titanium.

Preferably, a preparation method for the transport layer is one of spin coating, vacuum evaporation, sputtering, and subsequent transfer.

Preferably, a material of the transport layer is selected from one or more of $ZnO$, $TiO_2$, and $MoO_3$.

The invention further provides an application of the organic single crystal composite oriented polymer membrane according to the above, the organic single crystal composite oriented polymer membrane prepared by the method according to the above, and the optoelectronic device according to the above in any one or more of organic photovoltaic field, organic photoelectric detection field, organic display field, transportation and logistics field, mining and metallurgy field, environmental field, medical instrument field, explosion-proof detection field, food field, water treatment field, pharmaceutical field, and biological field.

Due to the adoption of the above technical solutions, the invention has the following advantages and positive effects compared with the prior art:

The invention overcomes technical prejudice and realizes the preparation of a composite membrane for the heterojunction of the organic single crystal and the oriented polymer, and the oriented polymer is composed of organic polymer fibers oriented in a single direction, which, together with the organic semiconductor single crystal, ensures the long-range ordering of the entire heterojunction and facilitates high-speed migration of carriers and long-distance diffusion of excitons; the organic semiconductor single crystal tightly wraps the polymer fiber, so that the fiber is embedded in the organic single crystal to form a larger interface area for the heterojunction, which increases the distribution range of the built-in electric field and promotes the dissociation of photo-generated excitons.

The invention combines the advantages of long-range ordering and bulk heterojunction, and the photophysical properties are greatly improved as compared with the existing preparation methods. The long-range ordering of the organic semiconductor single crystal and the oriented polymer organic semiconductor ensures long-distance diffusion of the excitons and efficient migration of the carriers, so that the excitons may fully migrate to the interface of the heterojunction, and the dissociated carriers may be efficiently extracted and collected, reducing losses caused by defect trapping; the large-area close contact of the bulk heterojunction enables the excitons to dissociate efficiently, reducing the energy loss caused by recombination and increasing the utilization rate of incident light energy; therefore, finally, the long-range ordered bulk heterojunction structure exhibits significant fluorescence quenching and the lowest fluorescence lifetime, and is expected to be applied in the design of high-performance photoelectric conversion-related devices.

In order to realize the preparation of the oriented polymer membrane, the invention relies on the repulsion of polymer solutes by solvent crystals during the directional crystallization process, confining it in a two-dimensional space of one thin membrane, and further achieving one-dimensional orientation through the flow field during the crystallization process. In order to achieve close adhesionbetween the organic single crystal and the oriented polymer fiber, the growth of the organic single crystal on the polymer fiber is facilitated in the invention by controlling the thickness, the concentration and the solidification speed of the liquid membrane of the organic polymer solution during the preparation of the oriented polymer, and hence, by controlling the undulation of the polymer fiber of the oriented polymer; and, appropriate substrate modifications are selected to control the nucleation position of the organic semiconductor, the flexibility of the membrane-like single crystal is utilized to adhere to the undulation of the underlying polymer fiber, and appropriate concentrations, temperatures for crystal growth, solvents and evaporation rates thereof of the organic semiconductor solution are selected, so that the organic semiconductor solution is grown into the organic single crystal that closely adheres to the underlying oriented polymer fiber after being completely volatilized.

Moreover, the invention is based on a solution method for preparation, is easy to operate, and has a wide range of applications, wherein the material system has certain designability, does not require specific complex equipment, and has certain prospects for up-scalingpreparation.

Figure 1:
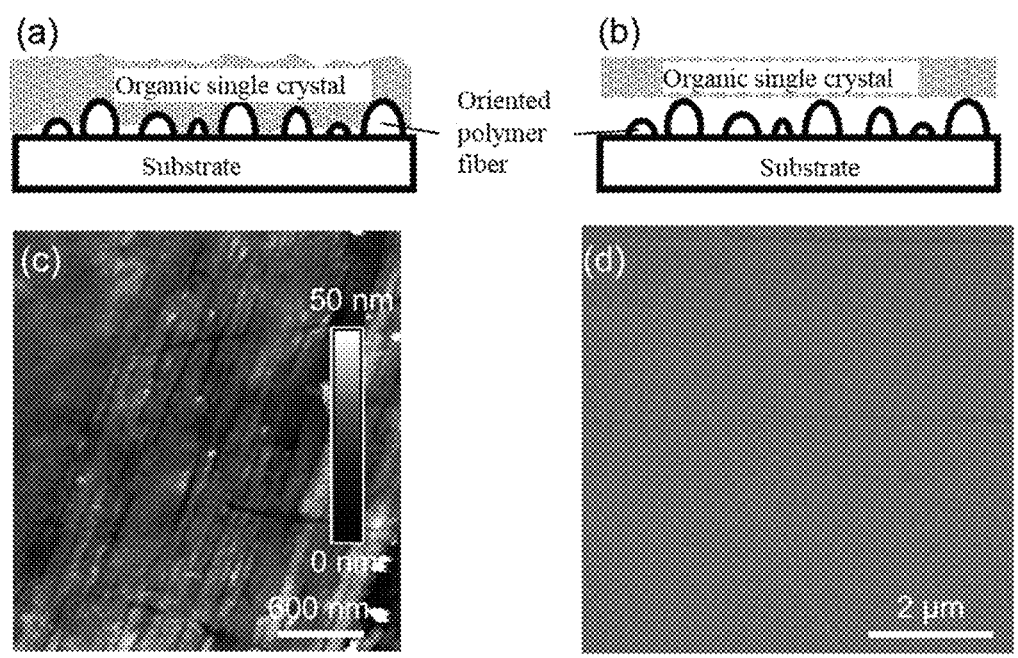
FIG. 1 shows two cases of growing an organic single crystal above an oriented polymer fiber, wherein (a) is that the organic single crystal of the invention tightly wraps and is embedded in the polymer fiber to form a bulk heterojunction; (b) is that a contact area between the organic single crystal and the polymer fiber is small and is only supported by a few undulating points on the fiber while the single crystal itself maintains a flat crystal plane; (c) is an AFM height map of an adhesionsurface between the organic single crystal and the oriented polymer fiber in Embodiment 6, corresponding to the situation in (a); (d) is an SEM image of a contact surface between an oriented P3HT fiber on the bottom with a C60 single crystal obtained by uniform nucleation in droplets by the poor solvent diffusion method, which can show that the surface is almost flat except for a few growth steps, corresponding to the situation in (b)

Descriptions for reference numerals: 1—motor; 2—screw; 3—ball nut; 4—temperature gradient hot stage; 5—fixture; 6—substrate.

DETAILED DESCRIPTION OF THE INVENTION

An organic single crystal composite oriented polymer membrane, a preparation method therefor, an optoelectronic device, and an application thereof proposed by the invention will be further described in detail below with reference to the accompanying drawings and specific embodiments. The advantages and features of the invention will become clearer from the following description.

The invention provides an organic single crystal composite oriented polymer membrane, which includes an organic single crystal and an oriented polymer. As shown in (a) of FIG. 1, the oriented polymer is composed of multiple polymer fibers of different lengths that grow in a single direction, and the organic single crystal tightly wraps the polymer fiber to form an effective contact over a large area. The tight wrapping refers to the undulating growth of the organic single crystal adhering to the surface of the polymer fiber. The relative concept is "the undulating growth of a small-molecule single crystal that do not adhere to the surface of the oriented polymer fiber". The characteristic is that the surface of the small-molecule single crystal in contact with the fiber is a straight convex surface without depressions (as shown in (b) of FIG. 1).

The tight wrapping may be confirmed by observing the morphology with a scanning electron microscope (SEM) and measuring the height with an atomic force microscope (AFM). As shown in FIG. 1, if a large area of effective contact is formed between an upper organic single crystal and a lower oriented polymer, the upper organic single crystal will form highly undulating surfaces due to the undulations of the lower polymer fibers, and indentations are formed on a lower surface of the organic single crystal due to contact with the polymer fiber. Therefore, SEM and AFM may be directly used to observe whether there are undulations on the upper surface of the upper organic single crystal; further, polyvinyl alcohol (PVA) is used to prepare an aqueous solution with 10% mass fraction, which is spin-coated on the composite membrane at 2000 rpm for 30 s and then peeled off after drying so that a bonding surface between the upper organic single crystal and the polymer fiber is exposed to observe whether there are any indentations on the bonding surface to determine whether they are closelyadhered. SEM may also be used to observe whether the side of the organic single crystal has a curved profile that adheres to the underlying polymer fiber.

Further, the tight wrapping may be characterized by AFM measurement of the depth of the indentation on the bonding surface of the organic single crystal and the polymer fiber. The indentation refers to a small width (usually no more than 100 nm) in which a sample height decreases relative to an edge position of this width range, and the sample height on both sides of this width range is almost the same. Due to the greater length of the underlying polymer fiber, the indentations are generally considered to be of similar length. Since the polymer fiber is embedded inside the organic single crystal, an indentation is formed on the lower surface. The height difference between the lowest position of the indentation and the edge of the indentation is the depth of the indentation. If the polymer fiber is not embedded with the organic single crystal, then a bottom surface of the organic single crystal should be flat or have only growth steps and there should be no indentations, i.e., the depth of the indentation is 0 nm. Therefore, 10 indentations on the lower surface of the organic single crystal may be randomly selected to measure an average depth of the indentations for reflecting the adhesionbetween the organic single crystal and the oriented polymer. Preferably, if the depth d of the indentation is greater than or equal to 5 nm, it can be considered that the single crystal and the oriented fiber are closely adhered.

Figure 2:
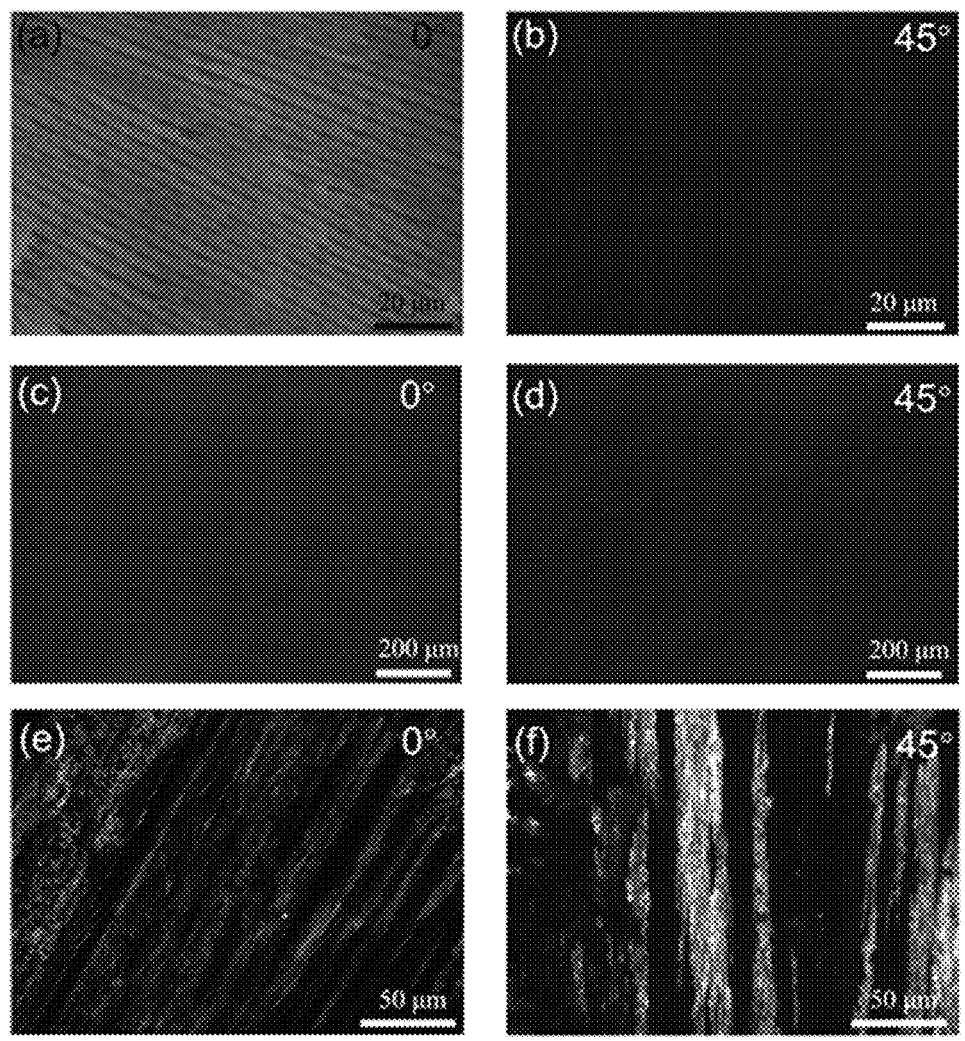
FIG. 2 shows three situations in which the long-range ordering of samples can be judged under orthogonal polarized light through polarizing microscopy, wherein (a) and (b) show that the organic single crystal formed in Embodiment 1 shows synchronous light and dark changes and has long-range ordering; (c) and (d) show that a non-oriented P3HT fiber membrane formed in Comparative Example 7 has no brightness and no long-range ordering; (e) and (f) show that an organic polycrystal formed in Comparative Example 1 always has brightness and no long-range ordering.

The long-range ordering may be preliminarily judged through the polarizing microscope with a specific detection method as follows: a sample is placed on a sample stage and magnified to a suitable multiple, such as tens or hundreds of times, and then the microscope is operated in a transmitted or reflected light mode; when the sample substrate is opaque, the microscope is operated in the reflected light mode; When a polarization angle of a microscope polarizer is orthogonal to a polarization angle of an analyzer, the sample stage is rotated, and if the organic single crystal and the oriented polymer show consistent alternating light and dark changes in the entire field of view, it means that both have long-range ordering; if there is always no brightness when the sample stage is rotated under orthogonal polarized light, after ruling out the possibilities that 1) a main optical axis of the organic single crystal coincides with an incident direction of an incident light and 2) the organic single crystal is a cubic crystal system, it means that both the organic single crystal and the oriented polymer have amorphous short-range ordered structures; if the sample stage is always bright when rotating under orthogonal polarized light but does not show consistent alternating light and dark changes, it means that the small-molecule crystal and the oriented fiber are polycrystalline with non-uniform orientation. The schematic diagram of the three situations is shown in FIG. 2.

The principle of determining whether the organic semiconductor crystal and the oriented polymer fiber have long-range ordering by using an optical microscope with orthogonal polarizers is: when a beam of polarized incident light is incident along a non-main optical axis of a crystal that may undergo birefringence, the birefringence occurs, and the original polarized light is separated into two beams of light with polarization directions perpendicular to each other with one having the same polarization direction as the incident light. When the observation is performed with the analyzer orthogonal to the polarization direction of the polarizer, the crystal will have a certain brightness in the field of view due to the birefringence, and as the sample is rotated on the stage, the brightness will show a uniform alternating change of light and dark. Therefore, by observing whether consistent brightness changes occur, the long-range ordering of the system may be determined.

Figure 3:
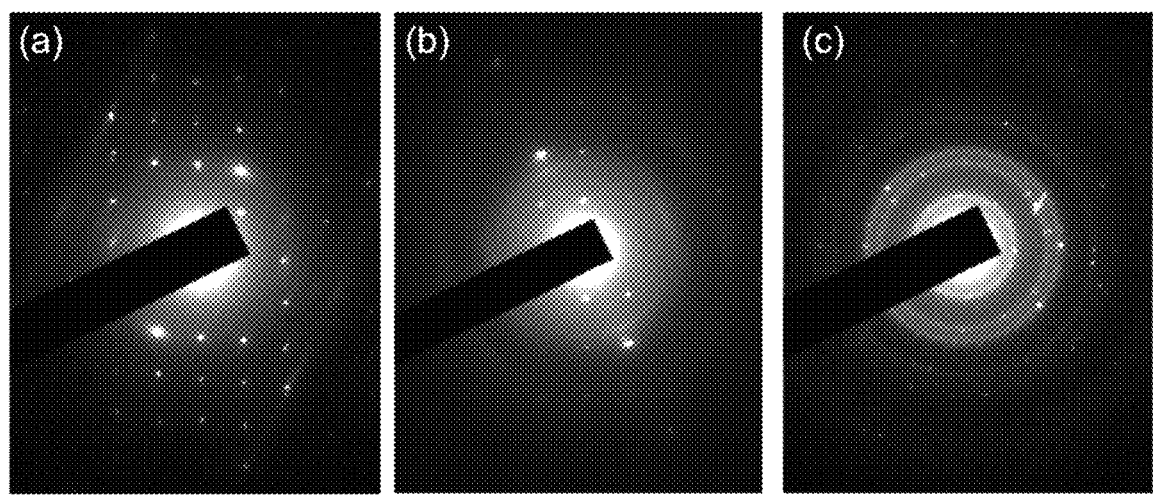
FIG. 3 shows that an selected area electron diffraction is used to determine whether the system has long-range ordering, wherein (a) shows that Embodiment 1 shows two sets of single-crystal-like diffraction spots of Tips-pentacene and P3HT with the system having long-range ordering; (b) shows that Embodiment 6 shows two sets of single-crystal-like diffraction spots of Tips-TAP and P3HT with the system having long-range ordering; (c) shows that Tips-pentacene in Comparative Example 8 shows multiple sets of diffraction spots with P3HT showing diffraction rings and the system having short-range order.

The long-range ordering may also be confirmed by selected area electron diffraction with a specific detection method as follows: the sample is cut into a suitable size, placed on a bare copper grid, and observed in a transmission electron microscope (TEM), wherein an acceleration voltage of an electron beam is 200 kV, and the sample area irradiated by the selected area electron diffraction is a circular area with a diameter of about 1 μm; to avoid damages on the electron beam, it is necessary to capture diffraction images immediately after moving to an area that has not been irradiated by the electron beam; If two sets of single crystal diffraction patterns are obtained, and the diffraction patterns are calibrated to correspond to unit cell parameters of the organic single crystal and the oriented polymer respectively, it means that the obtained structure has long-range ordering; if diffraction rings or multiple sets (greater than or equal to 2) of diffraction patterns are obtained and two sets of diffraction patterns correspond to the same substance, it means that the obtained structure does not have long-range ordering. The schematic diagram is shown in FIG. 3.

The principle of determining whether the organic semiconductor crystal and the oriented polymer fiber have long-range ordering by selected area electron diffraction is: when a substance has long-range ordering, each lattice point in the substance scatters the electron beam in the same manner, causing the electron beam to be coherently enhanced only at certain specific positions, presenting a singleset of regularly arranged diffraction spots; when the substance does not have long-range ordering, each lattice point scatters the electron beam in all directions, causing to present multiple sets of diffraction spots, diffraction rings or dispersion rings. Therefore, determining whether the system has long-range ordering is performed by observing whether a single set of diffraction spots appears in electron beam diffraction.

A uniformity of the alignment of the oriented polymer along a certain direction is characterized by the orientation. The orientation is obtained by calculating the peak shape with Formula 1 after fitting by injecting X-rays along the orientation direction and selecting the (100) crystal plane diffraction spot intensity to plot the azimuth angle with the help of the grazing-incidence wide-angle scattering (GI-WAXS) images.

$$\Pi = \frac{180° - H}{180°} \times 100\% \quad (1)$$

wherein H is the full width at half maximum of the diffraction peak, in degrees (°).

The organic semiconductor forming the organic single crystal is selected from one or more of linear benzo compounds and derivatives thereof, linear heterobenzo compounds and derivatives thereof, benzothiophene compounds and derivatives thereof, perylene and derivatives thereof, and fullerene and derivatives thereof, and further, preferably, is selected from 6,13-bis(triisopropylsilylethynyl)-pentacene (Tips-pentacene), 6,13-bis-(triisopropylsilylethynyl)-5,7,12,14-tetraazapentacene or 2,7-dioctyl[1]benzothieno[3,2-b][1]-benzothiophene (C8-BTBT), or fullerene (C60) or perylene.

The organic polymer forming the oriented polymer may be selected from a linear conjugated homopolymer, a donor-acceptor alternating copolymer, or a polymer formed by polymerization of organic semiconductors with a molecular weight less than 10000; further, preferably, the organic polymer is poly(3-hexylthiophene-2,5-diyl) (P3HT), PM6, PY-1T, etc.

In the invention, the organic single crystal composite oriented polymer membrane further includes a substrate, wherein the oriented polymer is arranged and grown in a single direction on the substrate. Here, the substrate may be a substrate in a narrow sense, and the substrate may be just a hard substrate such as glass, silicon wafer, metal oxide ($AlO_x$, ITO, FTO), or a flexible substrate such as polyimide (PI), polyethylene terephthalate (PET)), mica flakes, etc.; the substrate may be modified by a self-assembled molecule containing silane groups, a self-assembled molecule containing phosphate groups, or a self-assembled molecule containing thiol groups; The substrate may also be a substrate in a broad sense; that is to say, when applied to the semiconductor device, it may have electrodes and a transport layer as the substrate, and polymer fibers are oriented and grown on the transport layer.

The invention further provides a preparation method for the oriented polymer membrane in the above organic single crystal composite oriented polymer membrane, and the oriented organic polymer membrane is obtained on the substrate through spatial confinement and directional crystallization.

Figure 4:
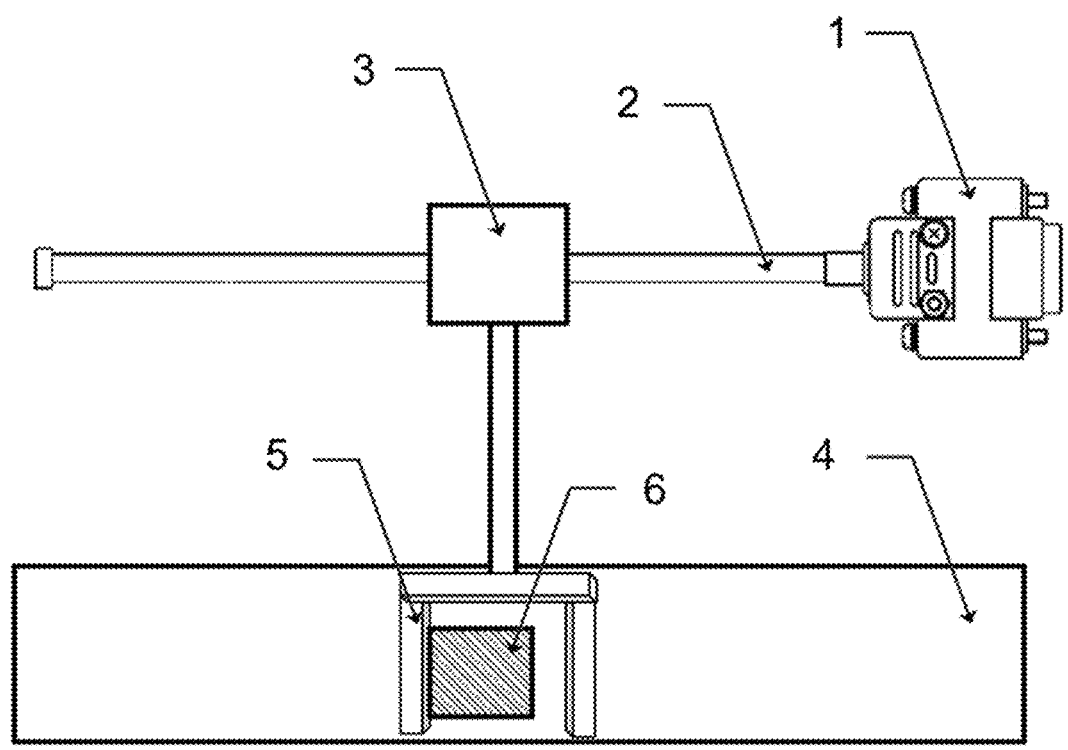
FIG. 4 is a top diagram of a device used to obtain the oriented polymer fiber through spatial confinement and directional crystallization.

The spatial confinement and directional crystallization method is used to prepare the oriented organic polymer membrane by an apparatus shown in FIG. 4 including a motor 1, a screw 2, a ball nut 3, a fixture 5 and a temperature gradient hot stage 4. An output shaft of the motor 1 is connected with the screw 2, and the screw 2 is in threaded connection with the ball nut 3. The fixture 5 is used to drag the substrate, and the temperature gradient hot stage 4 is arranged parallel to the screw 2. The fixture 5 is fixedly connected with the ball nut 3, and the fixture 5 is placed on the temperature gradient hot stage 4. The motor 1 drives the screw 2 to rotate, and then the ball nut 3 moves on the screw 2, which drives the fixture 5 to move from a high temperature area to a low temperature area on the temperature gradient hot stage 4; a moving speed of the fixture 5 is equal to a moving speed of the substrate, which is equal to a solidification speed of the organic polymer. The temperature gradient hot stage 4 may be a Kofler melting point apparatus. The substrate is placed on the temperature gradient hot stage 4. A size of the substrate should not exceed a size of the hot stage, and preferably, is a square with a side length of 1-1.5 cm.

The method for preparing the oriented polymer membrane using the apparatus shown in FIG. 4 is as follows.

Preparation of an organic polymer solution: a required mass of the organic polymer and an organic solvent that is solid at room temperature are weighed, and heated to melt the organic solvent to form an organic polymer solution;
then, the substrate 6 is clamped by the fixture 5, and after the temperature reaches equilibrium, a clean glass dropper is used to absorb a small amount of organic polymer solution to add 2-4 drops onto the substrate while quickly covering the solution droplets with a clean glass sheet modified with OTS that is above the melting point of the organic solvent and preheated on the hot stage. The motor 1 is turned on to move the fixture 5 with the substrate 6 on the temperature gradient hot stage 4 and moved toward the low temperature area at a constant speed until the liquid membrane is completely solidified while controlling the moving speed on the temperature gradient hot stage. Preferably, the moving speed is 5-800 μm/s. A temperature of an initial placement position of the substrate is not lower than the melting point of the organic solvent used. Then, items pre-cooled at low temperature (such as tweezers heads, needles, etc.) are touched to the surface of the glass sheet at a low-temperature side of the temperature gradient hot stage, so that a temperature gradient is formed in a vertical direction from the substrate to the glass sheet covered above, and the organic solvent in the liquid membrane nucleates and grows on the surface of the glass sheet above under induction of low temperature. Once nucleation of the organic solvent is observed, the precooled items used to induce nucleation may be removed. The glass sheet may be pressed with a weight of m≥100 g to reduce a thickness of the liquid membrane sandwiched between the glass sheet and the substrate, so that a thickness of the obtained polymer membrane becomes smaller, and the spatial confinement effect is increased, which is beneficial to the formation of the orientation structure.

When the fixture moves the substrate with the substrate to the low temperature area of the temperature gradient hot stage at a constant speed, during the growth process of solvent crystals, organic polymer solutes will be continuously squeezed out and enriched in a very thin thickness range close to the substrate surface, and directional movement on the temperature gradient hot stage leads to directional crystallization of the organic solvent, so that the polymer exhibits a decreasing concentration gradient from the low temperature area to the high temperature area of the temperature gradient hot stage. Therefore, under the combined action of the spatial confinement effect and the concentration gradient, the polymer gradually crystallizes and precipitates with the directional crystallization of the solvent from high to low temperature areas, until the liquid membrane is completely solidified, and finally, a polymer semiconductor membrane with a single direction orientation is obtained.

After the liquid membrane is completely solidified, the glass sheet is peeled off, and the solidified liquid membrane is placed in an environment lower than the melting point of the organic solvent or in a vacuum to sublimate the organic solvent, or an orthogonal solvent is used to remove the solid organic solvent, i.e., the oriented polymer membrane is obtained on the substrate. The orthogonal solvent refers to a solvent that dissolves the solid organic solvent but does not dissolve the oriented polymer prepared.

The organic solvent that dissolves the organic polymer generally have good solubility for the corresponding organic polymer, are solid at room temperature, and are easily removed by sublimation or orthogonal solvent dissolution. Preferably, the solvent is a chlorinated aromatic hydrocarbon solvent, such as 1,3,5-trichlorobenzene, 1,2,3-trichlorobenzene, or 1,2,4,5-tetrachlorobenzene.

The "low temperature" in "items pre-cooled at lower temperature" is a relative concept, which is generally lower than the melting point of the organic solvent. If the difference between the melting point of the organic solvent and the melting point of the organic solvent is above 80° C., it can be considered that the item is pre-cooled at low temperature.

The invention further provides a preparation method for the above organic single crystal composite oriented polymer membrane, which includes firstly preparing an oriented polymer through the above spatial confinement method and directional crystallization method, and growing an organic single crystal on the oriented polymer by solution method.

The invention will be described in detail in combination with specific embodiments and comparative examples using the above-mentioned characterization methods.

Embodiment 1

A preparation method for composite membrane structure based on Tips-pentacene organic single crystal semiconductors and oriented P3HT fibers includes the following steps:
(1) a P-type <100> silicon wafer with a thickness of 575 μm is taken, there is a 300 nm thick silicon dioxide insulation layer on the silicon wafer, and a BCB modified substrate is spin-coated on the silicon substrate;
(2) a 1,3,5-trichlorobenzene solution of 2 mg/mL of P3HT is prepared to be heated at 90° C. and fully dissolved;
(3) the substrate prepared in the step (1) is placed on the kofler melting point apparatus (i.e., the temperature gradient hot stage in FIG. 4), wherein a right side of the melting point apparatus is the low temperature area, and a left side thereof is the high temperature area; a right edge of the substrate is aligned to approximately 63° C., a left side of the substrate to the fixture, and a clean glass dropper is used to drip 2-3 drops of the solution prepared in the step (2) onto the substrate; then an OTS-modified glass sheet preheated at 80° C. is quickly used to cover, and a 100 g weight preheated at 63° C. is pressed thereon;
(4) a servo motor turned on, and the fixture pushes the substrate to move to the low temperature area at a constant speed of about 40 μm/s, causing 1,3,5-trichlorobenzene to slowly undergo directional solidification;
(5) when the liquid membrane is completely solidified, the substrate is stood for about 3 minutes at about 50° C., then the substrate is removed from the hot stage, and the OTS-modified glass sheet covering thereon is uncovered;
(6) the obtained substrate is allowed to stand at room temperature for one day to allow 1,3,5-trichlorobenzene to completely volatilize, and an oriented P3HT membrane is obtained;
(7) the substrate prepared in the step (6) is placed on a 24×24 mm² coverslip, and the coverslip is placed in a high polystyrene plastic petri dish with a diameter of 35 mm and a height of 10 mm, wherein a stainless steel embroidery needle is placed on the substrate as a pinner; the whole is placed on a 25° C. hot stage to preheat for 10 minutes to allow the temperature to reach equilibrium, wherein during the growth of the organic single crystal, the petri dish has been placed on the hot stage;
(8) a n-hexane solution of 0.4 mg/mL Tips-pentacene is prepared, and sonicated for 20 minutes to completely dissolve the solute;
(9) a pipette is used to draw 20 μL of the solution prepared in the step (8), and gently dripped onto the needle on the substrate without letting the droplet slip off the substrate; then, a lid of the Petri dish is quickly covered and the Petri dish is sealed with a sealing film;
after the above is stood for about 10 minutes and the solvent is completely evaporated, the petri dish is opened to remove the pinner, and then the Tips-pentacene single-crystal-array composite P3HT oriented fiber membrane is obtained on the substrate.

Figure 5:
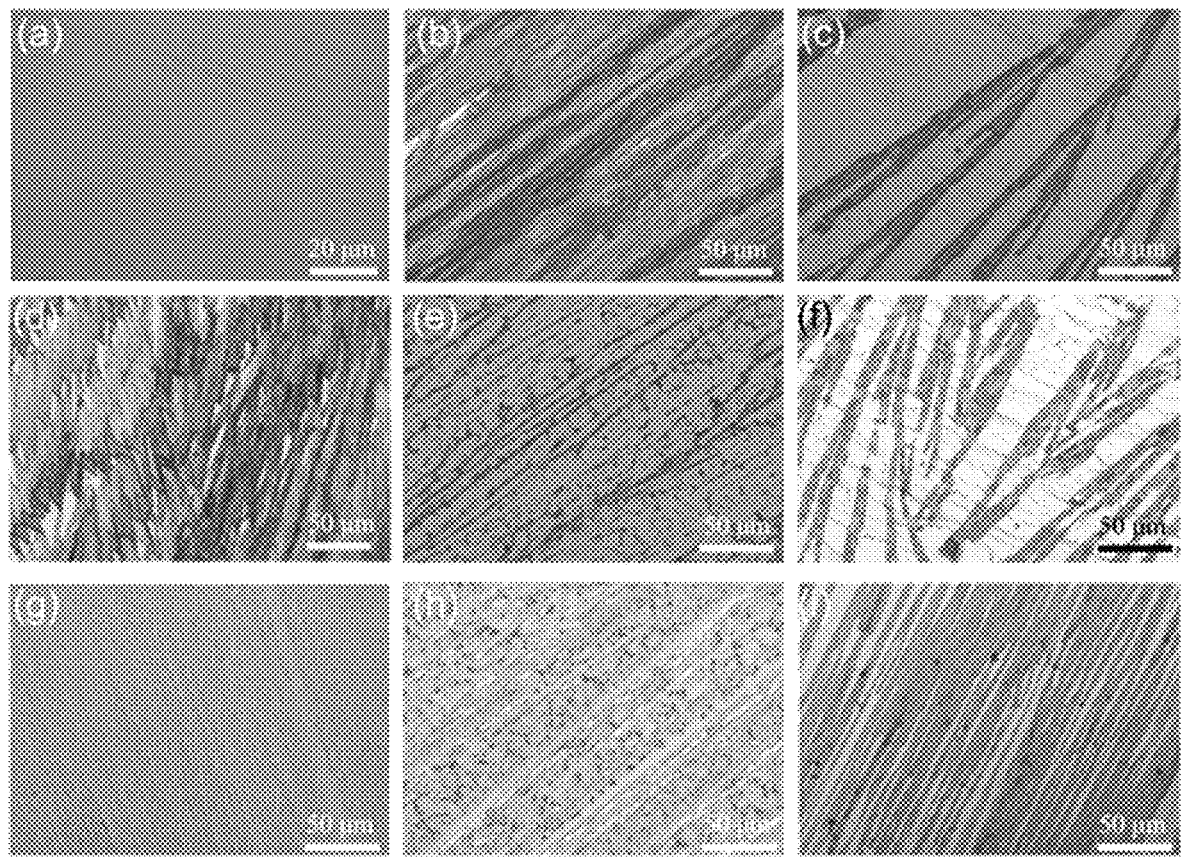
FIG. 5 is an optical microscope morphology of the composite membrane obtained in the Embodiments and Comparative Examples of the invention, wherein (a) is for Embodiment 1, (b) is for Comparative Example 1, (c) is for Comparative Example 2, (d) is for Comparative Example 3, (e) is for Comparative Example 4, (f) is for Comparative Example 5, (g) is for Embodiment 6, (h) is for Comparative Example 6, and (i) is for Embodiment 8.
Figure 6:
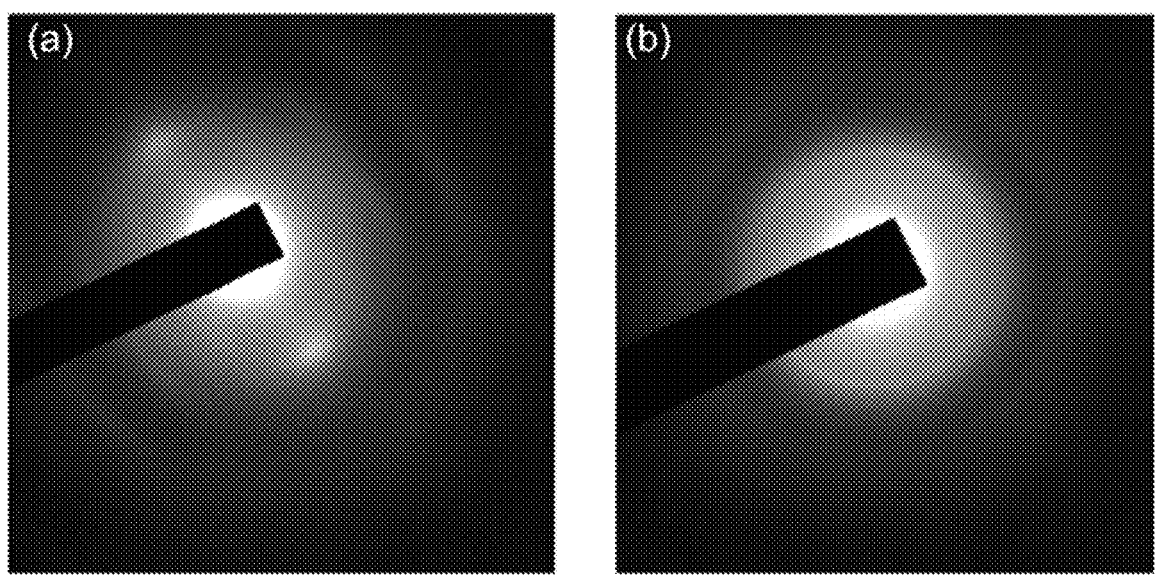
FIG. 6 shows selected area electron diffraction images of P3HT obtained, wherein (a) shows that in Embodiment 1, 1,3,5-trichlorobenzene is used as a solvent to obtain an oriented P3HT membrane through spatial confinement and directional crystallization; (b) shows a disordered P3HT membrane prepared by spin coating in Comparative Example 8.
Figure 7:
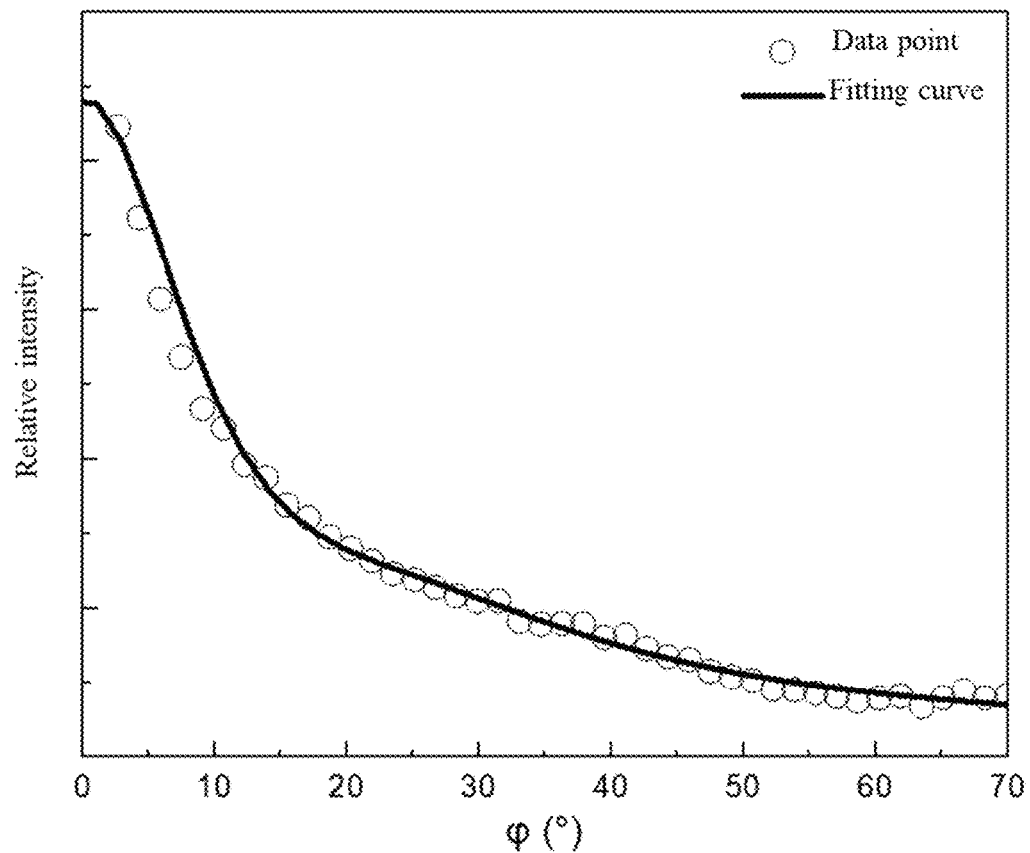
FIG. 7 is a two-dimensional GIWAXS diagram (100) of the crystal plane diffraction intensity plotted against an azimuth angle φ of P3HT obtained by spatial confinement and directional crystallization in Embodiment 1 when X-rays are incident along the orientation direction.
Figure 8:
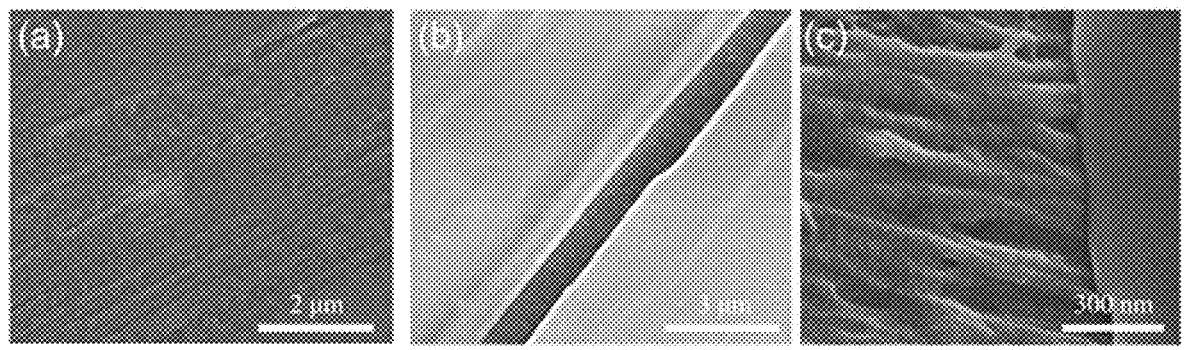
FIG. 8 is an SEM image of the organic single crystal in Embodiment 1, wherein (a) is for a bonding surface with the polymer fibers, (b) is for an upper surface of the organic single crystal, (c) is for an adhesionbetween a side of the organic single crystal and the polymer fiber.

In order to characterize the morphology and structure of the organic single crystal composite oriented polymer membrane, optical microscopy, scanning electron microscopy and atomic force microscopy are used to observe; the morphology of the obtained composite membrane is shown in FIG. 5 (a), and from FIG. 5 (a), it can be seen that the organic semiconductor is covered with strip-shaped crystals on the oriented P3HT fiber; and in FIG. 8, there are SEM morphology of the interface between the organic single crystal and the oriented polymer ((a) in FIG. 8), the morphology of the surface of the organic single crystal ((b) in FIG. 8), and the adhesionbetween the side of the organic single crystal and the oriented polymer ((c) in FIG. 8); from FIG. 8, it can be seen that the Tips-pentacene single crystal closely adheres to the oriented P3HT fiber. In order to characterize the long-range ordering of the organic single crystal composite oriented polymer semiconductor membrane, a polarized light microscope and a transmission electron microscope are used to observe selected area electron diffraction; as shown in (a) and (b) in FIG. 2, they are polarized microscope pictures, showing synchronous light and dark under orthogonal polarized light; as shown in (a) in FIG. 3, the selected area electron diffraction shows a set of Tips-pentacene single crystal diffraction spots and a set of P3HT diffraction spots, indicating that the whole has long-range ordering. In order to characterize the photophysical properties of the organic single crystal composite oriented polymer semiconductor membrane, a fluorescence spectrometer is used to test; as shown in (a) in FIG. 9, the composite membrane shows obvious fluorescence quenching phenomenon; from (a) in FIG. 10, it can be seen that the fluorescence lifetime is 109 ps. As shown in (a) in FIG. 6, the electron diffraction pattern of the obtained P3HT membrane shows diffraction spots similar to those of a single crystal without obvious diffraction rings, indicating that the membrane has good orientation in the overall thickness direction; and X-rays are incident along the orientation direction, and a two-dimensional GIWAXS diagram (100) crystal plane diffraction intensity plotted against the azimuth angle φ is obtained; as shown in FIG. 7, the orientation of the P3HT oriented polymer is obtained to be 87%. From (c) in FIG. 1, it can be seen that the depth of the indentation on the bottom surface of the Tips-pentacene single crystal is 7.3 nm.

Embodiment 2

A preparation method for composite membrane structure based on Tips-pentacene organic single crystals and oriented P3HT fibers includes the following steps.

Figure 11:
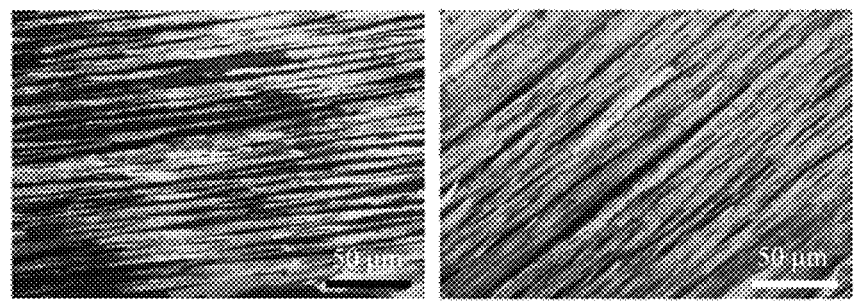
FIG. 11 is an optical microscope photo of Embodiment 2 under cross-polarized light.

The preparation method for the organic single crystal composite oriented polymer membrane in the embodiment is as described in Embodiment 1, wherein a concentration of the P3HT solution is 5 mg/mL. The characterization method for morphology and structure is the same as that in Embodiment 1. As shown in FIG. 11, the obtained composite membrane shows synchronous light and dark under orthogonal polarized light, and the depth of the indentation on the bottom surface of the Tips-pentacene single crystal is 9.2 nm.

Embodiment 3

A preparation method for composite membrane structure based on Tips-pentacene organic single crystals and oriented P3HT fibers includes the following steps.

Figure 12:
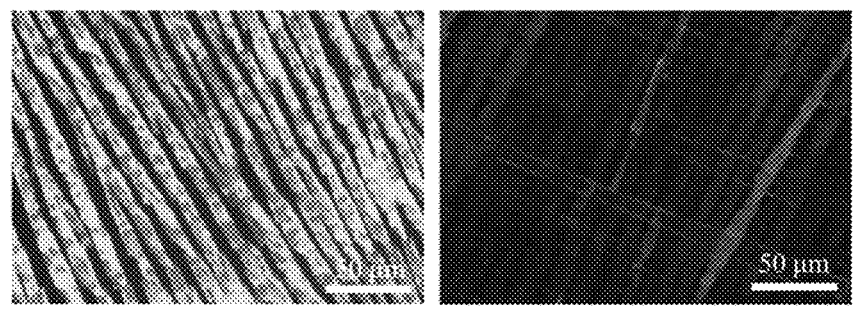
FIG. 12 is an optical microscope photo of Embodiment 3 under cross-polarized light.

The preparation method for the organic single crystal composite oriented polymer membrane of the embodiment is as described in Embodiment 1, wherein when the Tips-pentacene single crystal is grown, the hot stage is placed in a glove box with a water content of less than 5 ppm to preheat with a preheating temperature of 5° C., and just the lid of the Petri dish is covered without sealing with a sealing film after the Tips-pentacene n-hexane solution is added dropwise. The characterization method for morphology and structure is the same as that in Embodiment 1. As shown in FIG. 12, the obtained composite membrane shows synchronous light and dark under orthogonal polarized light, and the depth of the indentation on the bottom surface of the Tips-pentacene single crystal is 6.3 nm.

Embodiment 4

A preparation method for composite membrane structure based on Tips-pentacene organic single crystals and oriented P3HT fibers includes the following steps.

Figure 13:
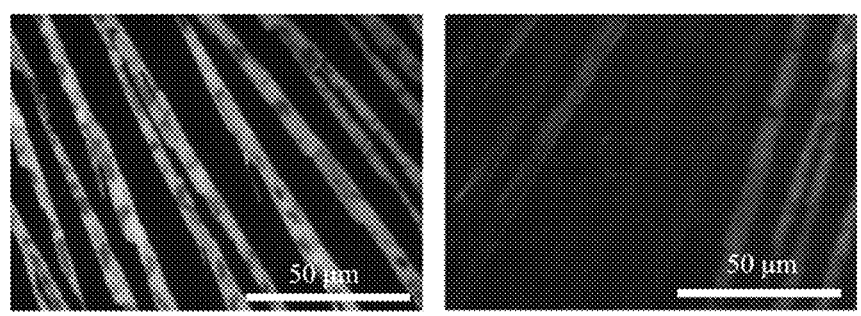
FIG. 13 is an optical microscope photo of Embodiment 4 under cross-polarized light.

The preparation method for the organic single crystal composite oriented polymer membrane in the embodiment is as described in Embodiment 1, wherein when the Tips-pentacene single crystal is grown, Tips-pentacene is dissolved in n-heptane, the concentration is still 0.4 mg/mL, and the preheating temperature of the hot stage is 38° C. The characterization method for morphology and structure is the same as that in Embodiment 1. As shown in FIG. 13, the obtained composite membrane shows synchronous light and dark under orthogonal polarized light, and the depth of the indentation on the bottom surface of the Tips-pentacene single crystal is 5.5 nm.

Embodiment 5

A preparation method for composite membrane structure based on Tips-pentacene organic single crystals and oriented P3HT fibers includes the following steps.

Figure 14:
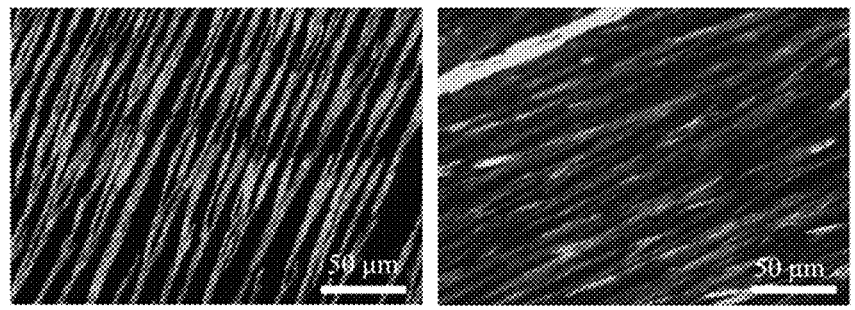
FIG. 14 is an optical microscope photo of Embodiment 5 under cross-polarized light.

The preparation method for the organic single crystal composite oriented polymer membrane in the embodiment is as described in Embodiment 1, wherein the substrate is a silicon wafer with a 300 nm thick silicon dioxide insulating layer that does not require BCB modification. The characterization method for morphology and structure is the same as that in Embodiment 1. As shown in FIG. 14, the obtained composite membrane shows synchronous light and dark under orthogonal polarized light, and the depth of the indentation on the bottom surface of the Tips-pentacene single crystal is 5.3 nm.

Embodiment 6

A preparation method for composite membrane structure based on Tips-TAP organic single crystals and oriented P3HT fibers includes the following steps.

Figure 15:
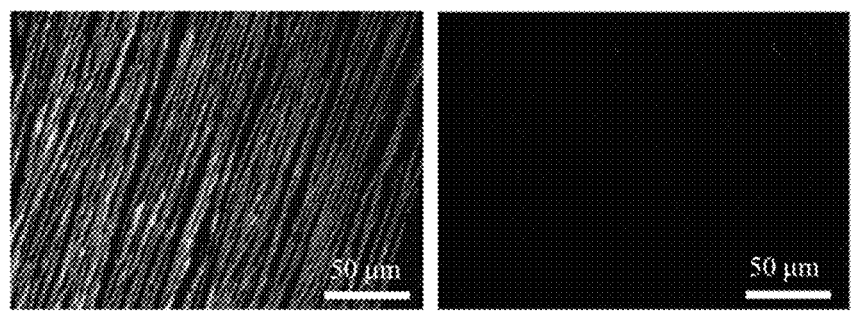
FIG. 15 is an optical microscope photo of Embodiment 6 under cross-polarized light.

The preparation method for the organic single crystal composite oriented polymer membrane in the embodiment is as described in Embodiment 1, wherein the substrate is a c-PMMA modified silicon wafer with a 300 nm thick silicon dioxide insulating layer, and when the Tips-TAP single crystal is grown, Tips-TAP is prepared into a 0.3 mg/mL n-hexane solution. The characterization method for morphology, structure, and performance is the same as that in Embodiment 1. The morphology of the obtained composite membrane is shown in (g) in FIG. 5, and the picture of the obtained composite membrane under the orthogonal polarized light microscope is shown in FIG. 15, showing synchronous light and dark under orthogonal polarized light; the depth of the indentation on the bottom surface of the Tips-TAP single crystal is 7.6 nm. The steady-state fluorescence shows obvious fluorescence quenching, as shown in (b) in FIG. 9. The fluorescence lifetime is calculated from the transient fluorescence fitting curve in (b) in FIG. 10 to be 112 ps.

Embodiment 7

A preparation method for composite membrane structure based on Tips-TAP organic single crystals and oriented P3HT fibers includes the following steps.

Figure 16:
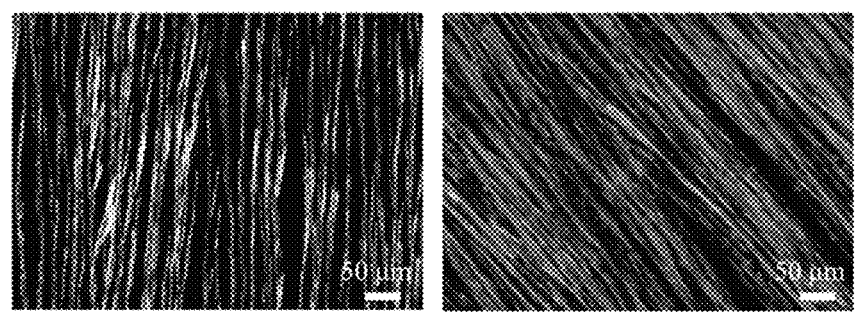
FIG. 16 is an optical microscope photo of Embodiment 7 under cross-polarized light.

The preparation method for the organic single crystal composite oriented polymer membrane in the embodiment is as described in Embodiment 1, wherein the substrate is a c-PMMA modified silicon wafer with a 300 nm thick silicon dioxide insulating layer, and when the Tips-TAP single crystal is grown, Tips-TAP is prepared into a 0.3 mg/mL m-xylene solution, and the preheating temperature of the hot stage is 45° C. The characterization method for morphology, structure, and performance is the same as that in Embodiment 1. As shown in FIG. 16, the obtained composite membrane shows synchronous light and dark under orthogonal polarized light, and the depth of the indentation on the bottom surface of the Tips-TAP single crystal is 6.9 nm.

Embodiment 8

A preparation method for composite membrane structure based on Tips-pentacene organic single crystal semiconductors and oriented P3HT fibers includes the following steps.

The preparation method for the oriented polymer fiber in the embodiment refers to the steps (1-6) of Embodiment 1, and then on this basis, the organic single crystal is prepared by a bar-coating method—that is, a meniscus coating method.

(1) A Tips-pentacene n-heptane solution with a concentration of 0.5 mg/mL is prepared, and dissolved fully with ultrasound;
(2) a distance between the coating bar and the substrate covered with the oriented polymer is adjusted to 200±5 µm;
(3) the substrate covered with the oriented polymer is preheated at 38° C. for 10 minutes, and then 10 µL of the solution prepared in the step (1) is dripped onto the coating bar so that the solution fills a gap between the coating bar and the substrate;

(4) the coating bar is controlled to move in a constant direction at a speed of 400±5 μm/s to coat the solution on the substrate;

(5) a dust-free paper is used to absorb the excess liquid between the coating bar and the substrate, i.e., preparing the organic single crystal on the oriented polymer.

Figure 17:
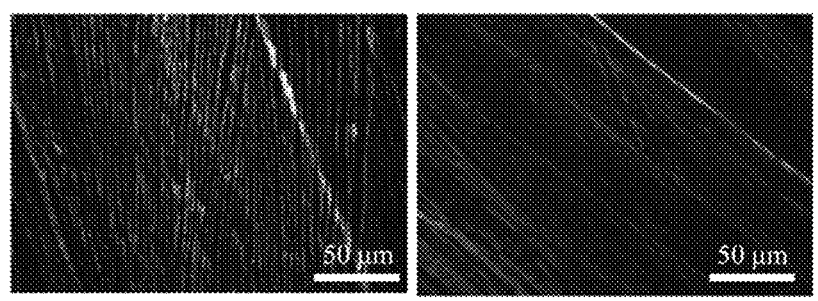
FIG. 17 is an optical microscope photo of Embodiment 8 under cross-polarized light.

The characterization method for morphology, structure, and performance is the same as that in Embodiment 1. The morphology of the obtained composite membrane is shown in (i) in FIG. 5; as shown in FIG. 17, the composite membrane shows synchronous light and dark under orthogonal polarized light, and the depth of the indentation on the bottom surface of the Tips-pentacene single crystal is 8.0 nm.

Embodiment 9

A preparation method for composite membrane structure based on C8-BTBT organic single crystals and oriented P3HT fibers includes the following steps.

Figure 18:
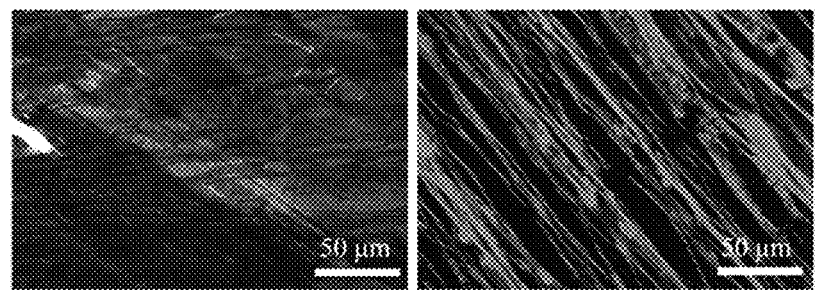
FIG. 18 is an optical microscope photo of Embodiment 9 under cross-polarized light.

The preparation method for the organic single crystal composite oriented polymer membrane in the embodiment is as described in Embodiment 1, wherein the organic semiconductor solution is a 0.6 mg/mL C8-BTBT 4-methyl-2-pentanone solution, and a growth temperature of the crystal is 55° C. The characterization method for morphology, structure, and performance is the same as that in Embodiment 1. As shown in FIG. 18, the obtained composite membrane shows synchronous light and dark under orthogonal polarized light, and the depth of the indentation on the bottom surface of the C8-BTBT single crystal is 7.4 nm.

Embodiment 10

A preparation method for composite membrane structure based on perylene organic single crystals and oriented P3HT fibers includes the following steps.

Figure 19:
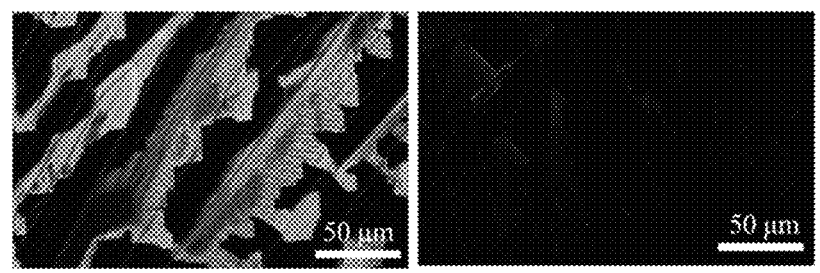
FIG. 19 is an optical microscope photo of Embodiment 10 under cross-polarized light.

The preparation method for the organic single crystal composite oriented polymer membrane in the embodiment is as described in Embodiment 1, wherein the organic semiconductor solution is a 0.4 mg/mL perylene m-xylene solution, the growth temperature of the crystal is 35° C., and no sealing film is needed. The characterization method for morphology, structure, and performance is the same as that in Embodiment 1. As shown in FIG. 19, the obtained composite membrane shows synchronous light and dark under orthogonal polarized light, and the depth of the indentation on the bottom surface of the perylene single crystal is 7.1 nm.

Embodiment 11

A preparation method for composite membrane structure based on C8-BTBT organic single crystals and oriented PM6 fibers includes the following steps.

Figure 20:
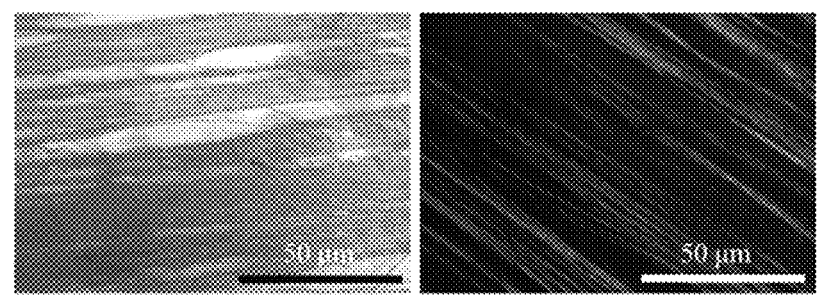
FIG. 20 is an optical microscope photo of Embodiment 11 under cross-polarized light.

The preparation method for the organic single crystal composite oriented polymer membrane in the embodiment is as described in Embodiment 9, wherein the organic polymer solution is a 1,3,5-trichlorobenzene solution of 2 mg/ml PM6, and the organic semiconductor solution is a n-hexane solution of 0.6 mg/mL C8-BTBT. The characterization method for morphology, structure and performance is the same as that in Embodiment 1. The orientation of the obtained oriented polymer membrane is 89%; as shown in FIG. 20, the composite membrane shows synchronous light and dark under orthogonal polarized light, and the depth of the indentation on the bottom surface of the C8-BTBT single crystal is 6.7 nm.

Embodiment 12

A preparation method for composite membrane structure based on Tips-pentacene organic single crystals and oriented PY-IT fibers includes the following steps.

Figure 21:
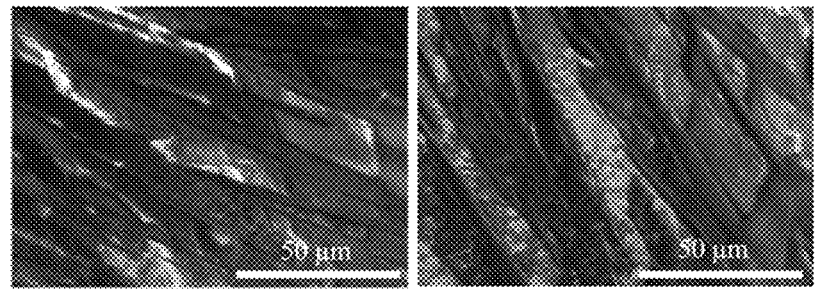
FIG. 21 is an optical microscope photo of Embodiment 12 under cross-polarized light.

The preparation method for the organic single crystal composite oriented polymer membrane in the embodiment is as described in Embodiment 1, wherein the organic polymer solution is a 1,2,4,5-tetrachlorobenzene solution of 2 mg/mL PY-IT. The characterization method for morphology, structure and performance is the same as that in Embodiment 1. The orientation of the obtained oriented polymer membrane is 78%; as shown in FIG. 21, the composite membrane shows synchronous light and dark under orthogonal polarized light, and the depth of the indentation on the bottom surface of the Tips-pentacene single crystal is 6.2 nm.

Embodiment 13

A preparation method for composite membrane structure based on C60 organic single crystal semiconductors and oriented P3HT fibers includes the following steps.

Figure 22:
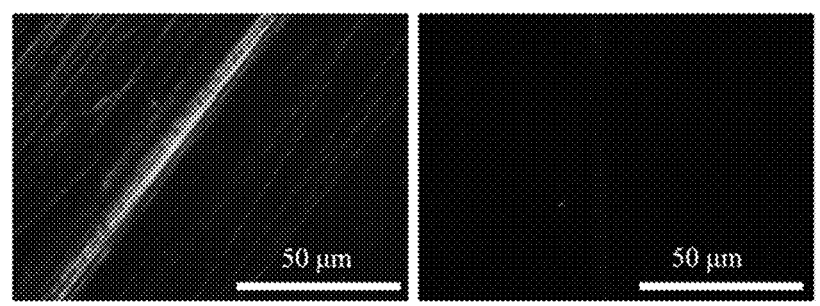
FIG. 22 is an optical microscope photo of Embodiment 13 under cross-polarized light.

The preparation method for the organic single crystal composite oriented polymer membrane in the embodiment is as described in Embodiment 1, wherein the organic semiconductor solution is a m-xylene solution of 0.4 mg/mL C60, and the growth temperature of the crystal is 30° C. The characterization method for morphology, structure, and performance is the same as that in Embodiment 1. As shown in FIG. 22, the obtained composite membrane shows synchronous light and dark under orthogonal polarized light, and the depth of the indentation on the bottom surface of the C60 single crystal is 7.9 nm.

Embodiment 14

A preparation method for composite membrane structure based on Tips-pentacene organic single crystals and oriented P3HT fibers includes the following steps.

The preparation method for the organic single crystal composite oriented polymer membrane in the embodiment is as described in Embodiment 1, wherein when the oriented polymer membrane is prepared, the moving speed of the fixture is 5 μm/s.

Embodiment 15

A preparation method for composite membrane structure based on Tips-pentacene organic single crystals and oriented P3HT fibers includes the following steps.

The preparation method for the organic single crystal composite oriented polymer membrane in the embodiment is as described in Embodiment 1, wherein when the oriented polymer membrane is prepared, the moving speed of the fixture is 300 μm/s.

Embodiment 16

A preparation method for composite membrane structure based on Tips-pentacene organic single crystals and oriented P3HT fibers includes the following steps.

The preparation method for the organic single crystal composite oriented polymer membrane in the embodiment is as described in Embodiment 1, wherein when the oriented polymer membrane is prepared, the moving speed of the fixture is 800 μm/s.

Embodiment 17

A preparation method for composite membrane structure based on Tips-pentacene organic single crystals and oriented P3HT fibers includes the following steps.

The preparation method for the organic single crystal composite oriented polymer membrane in the embodiment is as described in Embodiment 1, wherein the Tips-pentacene is prepared as a 0.2 mg/mL n-hexane solution.

Embodiment 18

A preparation method for composite membrane structure based on Tips-pentacene organic single crystals and oriented P3HT fibers includes the following steps.

The preparation method for the organic single crystal composite oriented polymer membrane in the embodiment is as described in Embodiment 1, wherein the Tips-pentacene is prepared as a 0.8 mg/mL n-hexane solution.

Embodiment 19

A preparation method for composite membrane structure based on Tips-pentacene organic single crystals and oriented P3HT fibers includes the following steps.

The preparation method for the organic single crystal composite oriented polymer membrane in the embodiment is as described in Embodiment 8, wherein a moving speed of the coating bar when preparing the organic single crystal membrane is 20 μm/s.

Embodiment 20

A preparation method for composite membrane structure based on Tips-pentacene organic single crystals and oriented P3HT fibers includes the following steps.

The preparation method for the organic single crystal composite oriented polymer membrane in the embodiment is as described in Embodiment 8, wherein a moving speed of the coating bar when preparing the organic single crystal membrane is 800 μm/s.

Comparative Example 1

A preparation method for composite membrane structure based on Tips-pentacene organic polycrysals and oriented P3HT fibers includes the following steps.

The preparation method for the organic polycrystalline composite oriented polymer semiconductor membrane in Comparative Example 1 is as described in Embodiment 1, wherein a concentration of P3HT solution is 10 mg/mL, and the same organic solvent as in Embodiment 1 is used to dissolve. Through observation with the microscopes, the Tips-pentacene membrane may be judged to be an organic polycrystalline membrane, as shown in (b) of FIG. 5.

Comparative Example 2

A preparation method for composite membrane structure based on Tips-pentacene organic polycrystalline semiconductors and oriented P3HT fibers includes the following steps.

The preparation method for the organic polycrystalline composite oriented polymer semiconductor membrane in Comparative Example 2 is as described in Embodiment 1, wherein a preheating temperature of the hot stage when the Tips-pentacene organic polycrystal is grown is 17° C. Through observation with the microscopes, the Tips-pentacene membrane may be judged to be a sparse organic polycrystalline membrane, as shown in (c) of FIG. 5.

Comparative Example 3

A preparation method for composite membrane structure based on Tips-pentacene organic polycrystalline semiconductors and oriented P3HT fibers includes the following steps.

The preparation method for the organic single crystal composite oriented polymer semiconductor membrane in Comparative Example 3 is as described in Embodiment 1, wherein a concentration of the Tips-pentacene solution is 1 mg/mL. Through observation with the microscopes, the Tips-pentacene membrane may be judged to be an organic polycrystalline membrane, as shown in (d) of FIG. 5.

Comparative Example 4

A preparation method for composite membrane structure based on Tips-pentacene organic polycrystalline semiconductors and oriented P3HT fibers includes the following steps.

The preparation method for the organic polycrystalline composite oriented polymer semiconductor membrane in Comparative Example 4 is as described in Embodiment 1, wherein a solvent used in the Tips-pentacene solution is cyclohexane. Through observation with the microscopes, the Tips-pentacene membrane may be judged to be a discontinuous organic polycrystalline membrane, as shown in (e) of FIG. 5.

Comparative Example 5

A preparation method for composite membrane structure based on Tips-pentacene organic polycrystalline semiconductors and oriented P3HT fibers includes the following steps.

The preparation method for the organic polycrystalline composite oriented polymer semiconductor membrane in Comparative Example 5 is as described in Embodiment 1, wherein when the P3HT oriented fiber is prepared, a moving speed of the fixture is 1000 μm/s. Through observation with the microscopes, the Tips-pentacene membrane may be judged to be a discontinuous organic polycrystalline membrane, as shown in (f) of FIG. 5.

Comparative Example 6

A preparation method for composite membrane structure based on Tips-TAP organic single crystal semiconductors and oriented P3HT fibers includes the following steps.

The preparation method for the organic single crystal composite oriented polymer semiconductor membrane in Comparative Example 6 is as described in Embodiment 6, wherein the Tips-TAP uses cyclohexane to prepare a solution. Through observation with the microscopes, the Tips-TAP membrane may be judged to be a discontinuous organic polycrystalline membrane, as shown in (h) of FIG. 5.

Comparative Example 7

A preparation method for composite membrane structure based on Tips-pentacene organic single crystal semiconductors and disordered P3HT fibers includes the following steps.

Figure 23:
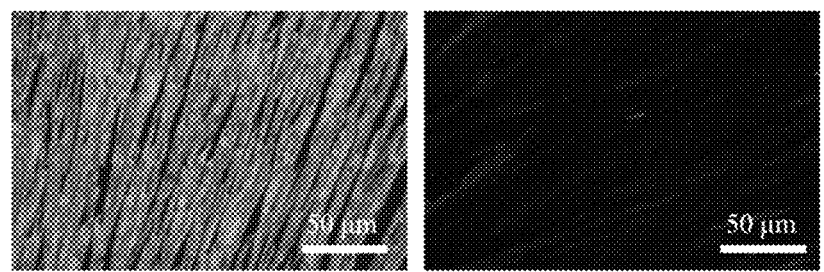
FIG. 23 is an optical microscope photo of Comparative Example 7 under cross-polarized light.

The preparation method for the organic single crystal in Comparative Example 7 is as described in Embodiment 1, wherein the preparation method for P3HT disordered membrane is as follows: a mixed solvent of o-dichlorobenzene and n-heptane with a volume ratio of 3:2 is used and heated to 60° C. to be completely dissolved for then standing at room temperature for one day, and the solution is spin-coated on a clean silicon wafer substrate at 8000 rpm. Through observation with the microscopes, the Tips-pentacene membrane shows synchronous light and dark, which may be judged as an organic single crystal membrane, as shown in FIG. 23. It can be judged that the P3HT has no orientation by showing diffraction rings in the selected area electron diffraction images, as shown in (b) of FIG. 6. The characterization of the transient fluorescence performance is shown in (a) of FIG. 10, and the fluorescence lifetime is 150 ps.

Comparative Example 8

A preparation method for blended membrane structure based on Tips-pentacene organic polycrystals and P3HT includes the following steps.
(1) A P-type <100> silicon wafer with a thickness of 575 µm is taken, there is a 300 nm thick silicon dioxide insulation layer on the silicon wafer, and a BCB modified substrate is spin-coated on the silicon substrate;
(2) the P3HT and the Tips-pentacene are mixed at a mass ratio of 1:7 to form a chlorobenzene solution with a total concentration of 15 mg/mL, and heated to 60° C. to be completely dissolved;
(3) the BCB modified substrate in the step (1) is cut into a size of 1×1 cm2 and placed on a spin coater;
(4) the solution prepared in the step (2) is dripped onto the substrate and spread over the substrate, and then the spin coater is turned on to spin coat at 1000 rpm for 60 s to obtain a blend membrane of the Tips-pentacene organic semiconductor and the P3HT.

Figure 10:
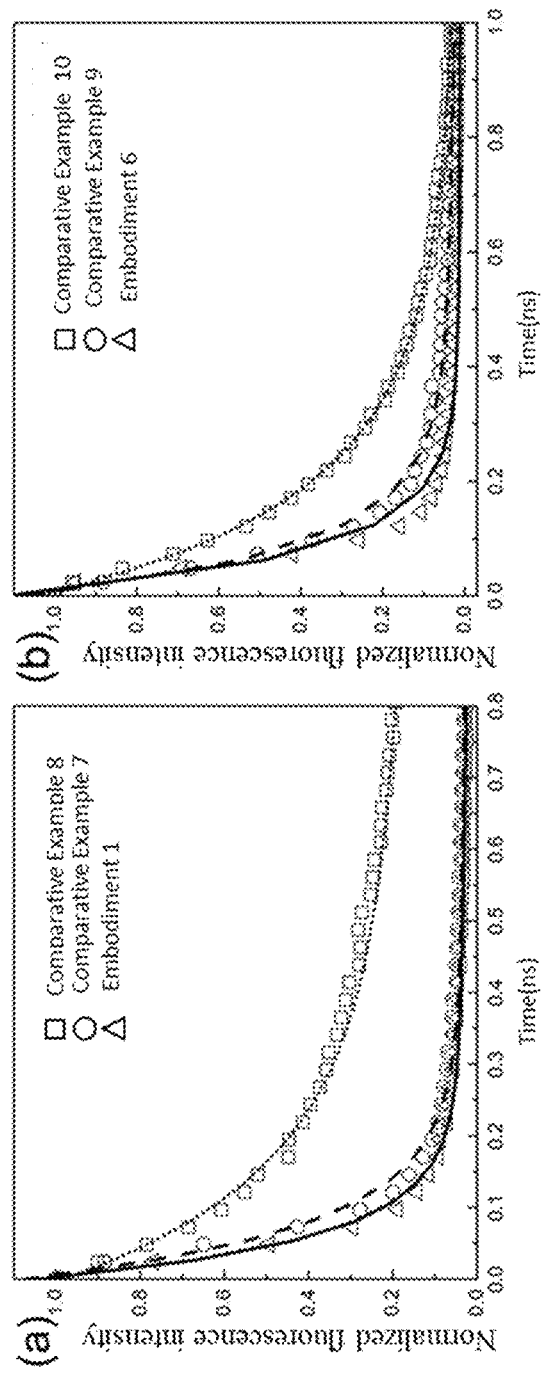
FIG. 10 shows a transient fluorescence test and data fitting thereof for the optoelectronic device, wherein (a) is for the optoelectronic device based on Embodiment 1, Comparative Example 7, and Comparative Example 8; (b) is for the optoelectronic device based on Embodiment 6, Comparative Example 9, and Comparative Example 10.

The blend membrane is composed of the disordered P3HT and the Tips-pentacene polycrystals, with the characterization method for structure and performance being the same as those in Embodiment 1, wherein the electron diffraction pattern shown in (b) of FIG. 3 is a diffraction ring, indicating that the obtained membrane structure does not have long-range ordering; as shown in (a) of FIG. 10, the transient fluorescence performance of the membrane is characterized, and the fluorescence lifetime is 571 ps.

Comparative Example 9

A preparation method for composite membrane structure based on Tips-TAP organic single crystals and disordered P3HT fibers includes the following steps.

The preparation method for the organic single crystal composite oriented polymer membrane in Comparative Example 9 is as described in Comparative Example 7. The characterization of the transient fluorescence performance is shown in (b) of FIG. 10, and the fluorescence lifetime is 154 ps.

Comparative Example 10

A preparation method for blended membrane structure based on Tips-TAP organic semiconductors and P3HT includes the following steps.

The preparation method for the blended membrane of the organic semiconductor and the P3HT in Comparative Example 10 is as described in Comparative Example 8, wherein the solution to be spin-coated is a chlorobenzene solution with a total concentration of 15 mg/mL of P3HT and Tips-TAP at a mass ratio of 1:7; the transient fluorescence performance is characterized as shown in (b) of FIG. 10, and the fluorescence lifetime is 240 ps.

The sample preparation conditions of the above embodiments and comparative examples are summarized in table form as follows:

The sample preparation conditions prepared using the droplet-pinned crystallization method are as follows:

| | organic polymer | Solvent to dissolve polymer | Concentration of polymer (mg/ml) | Moving speed of fixture (µm/s) | Organic semiconductor | Solvent to dissolve organic semiconductor | Concentration of organic semiconductor (mg/ml) | Growth temperature of single crystal (° C.) | Substrate |
|---|---|---|---|---|---|---|---|---|---|
| Embodiment 1 | P3HT | 1,3,5-trichlorobenzene | 2 | 40 | Tips-pentacene | n-Hexane | 0.4 | 25 | BCB |
| Embodiment 2 | P3HT | 1,3,5-trichlorobenzene | 5 | 40 | Tips-pentacene | n-Hexane | 0.4 | 25 | BCB |
| Embodiment 3 | P3HT | 1,3,5-trichlorobenzene | 2 | 40 | Tips-pentacene | n-Hexane | 0.4 | 5 | BCB |
| Embodiment 4 | P3HT | 1,3,5-trichlorobenzene | 2 | 40 | Tips-pentacene | n-heptane | 0.4 | 38 | BCB |
| Embodiment 5 | P3HT | 1,3,5-trichlorobenzene | 2 | 40 | Tips-pentacene | n-Hexane | 0.4 | 25 | 300 nm oxide film silicon wafer |
| Embodiment 6 | P3HT | 1,3,5-trichlorobenzene | 2 | 40 | Tips-TAP | n-Hexane | 0.3 | 25 | c-PMMA |
| Embodiment 7 | P3HT | 1,3,5-trichlorobenzene | 2 | 40 | Tips-TAP | m-xylene | 0.3 | 45 | c-PMMA |

-continued

| | organic polymer | Solvent to dissolve polymer | Concentration of polymer (mg/ml) | Moving speed of fixture (μm/s) | Organic semiconductor | Solvent to dissolve organic semiconductor | Concentration of organic semiconductor (mg/ml) | Growth temperature of single crystal (° C.) | Substrate |
|---|---|---|---|---|---|---|---|---|---|
| Embodiment 9 | P3HT | 1,3,5-trichloro-benzene | 2 | 40 | C8-BTBT | 4-methyl-2-pentanone | 0.6 | 55 | BCB |
| Embodiment 10 | P3HT | 1,3,5-trichloro-benzene | 2 | 40 | perylene | m-xylene | 0.4 | 35 | BCB |
| Embodiment 11 | PM6 | 1,3,5-trichloro-benzene | 2 | 40 | C8-BTBT | 4-methyl-2-pentanone | 0.6 | 25 | BCB |
| Embodiment 12 | PY-IT | 1,2,4,5-tetra-chloro-benzene | 2 | 40 | Tips-pentacene | n-Hexane | 0.4 | 25 | BCB |
| Embodiment 13 | P3HT | 1,3,5-trichloro-benzene | 2 | 40 | $C_{60}$ | m-xylene | 0.4 | 30 | BCB |
| Embodiment 14 | P3HT | 1,3,5-trichloro-benzene | 2 | 5 | Tips-pentacene | n-Hexane | 0.4 | 25 | BCB |
| Embodiment 15 | P3HT | 1,3,5-trichloro-benzene | 2 | 300 | Tips-pentacene | n-Hexane | 0.4 | 25 | BCB |
| Embodiment 16 | P3HT | 1,3,5-trichloro-benzene | 2 | 800 | Tips-pentacene | n-Hexane | 0.4 | 25 | BCB |
| Embodiment 17 | P3HT | 1,3,5-trichloro-benzene | 2 | 40 | Tips-pentacene | n-Hexane | 0.2 | 25 | BCB |
| Embodiment 18 | P3HT | 1,3,5-trichloro-benzene | 2 | 40 | Tips-pentacene | n-Hexane | 0.8 | 25 | BCB |
| Comparative Example 1 | P3HT | 1,3,5-trichloro-benzene | 10 | 40 | Tips-pentacene | n-Hexane | 0.4 | 25 | BCB |
| Comparative Example 2 | P3HT | 1,3,5-trichloro-benzene | 2 | 40 | Tips-pentacene | n-Hexane | 0.4 | 17 | BCB |
| Comparative Example 3 | P3HT | 1,3,5-trichloro-benzene | 2 | 40 | Tips-pentacene | n-Hexane | 1 | 25 | BCB |
| Comparative Example 4 | P3HT | 1,3,5-trichloro-benzene | 2 | 40 | Tips-pentacene | cyclohexane | 0.4 | 25 | BCB |
| Comparative Example 5 | P3HT | 1,3,5-trichloro-benzene | 2 | 1000 | Tips-pentacene | n-Hexane | 0.4 | 25 | BCB |
| Comparative Example 6 | P3HT | 1,3,5-trichloro-benzene | 2 | 40 | Tips-TAP | cyclohexane | 0.4 | 25 | BCB |
| Comparative Example 7 | P3HT | Blended solution of o-dichloro-benzene and n-heptane | 4 | 40 | Tips-pentacene | n-Hexane | 0.4 | 25 | BCB |
| Comparative Example 9 | P3HT | Blended solution of o-dichloro-benzene and n-heptane | 4 | 40 | Tips-TAP | n-Hexane | 0.4 | 25 | BCB |
| Comparative Example 8 | P3HT | Disordered fiber, spin-coated preparation | | | Tips-pentacene | | the P3HT and the Tips-pentacene are mixed at a mass ratio of 1:7 to form a chlorobenzene solution with a total concentration of 15 mg/mL | | BCB |
| Comparative Example 10 | P3HT | Disordered fiber, spin-coated preparation | | | Tips-TAP | | the P3HT and the Tips-TAP are mixed at a mass ratio of 1:7 to form a chlorobenzene solution with a total concentration of 15 mg/mL | | c-PMMA |

The sample preparation conditions for growing the organic single crystal using the meniscus coating method are as follows:

17-18, and Comparative Example 3), the growth temperature of the crystal and corresponding appropriate solvents (Embodiments 1, 3, 4, 6, 7 and 9, and Comparative

| | organic polymer | Solvent to dissolve polymer | Concentration of polymer (mg/ml) | Moving speed of fixture (μm/s) | Organic semiconductor | Solvent to dissolve organic semiconductor | Concentration of organic semiconductor (mg/ml) | Moving speed of coating tool (μm/s) | Substrate |
|---|---|---|---|---|---|---|---|---|---|
| Embodiment 8 | P3HT | 1,3,5-trichloro-benzene | 2 | 40 | Tips-pentacene | n-heptane | 0.5 | 400 | BCB |
| Embodiment 19 | P3HT | 1,3,5-trichloro-benzene | 2 | 40 | Tips-pentacene | n-heptane | 0.5 | 20 | BCB |
| Embodiment 20 | P3HT | 1,3,5-trichloro-benzene | 2 | 40 | Tips-pentacene | n-heptane | 0.5 | 800 | BCB |

Embodiments 1-7 and Comparative Examples 1-6 explore the effects of different preparation conditions on the crystallization of the organic semiconductor. The organic semiconductor single crystal may nucleate and grow at the gas-liquid interface or at the solid-liquid interface. The specific growth mode depends on the substrate modification layer. Therefore, it is necessary to select a suitable substrate and modification layer. From Embodiments 1, 5, and 6, the substrate is preferably modified with c-PMMA or BCB.

In order for the single crystal to span the pre-dispersed oriented polymer semiconductor fibers on the substrate, the organic semiconductor single crystal needs to nucleate and grow at the gas-liquid interface, and at the same time, the polymer fiber on the substrate should not have excessive undulations, which otherwise will affects the mass transfer during the growth process of the crystals. The undulations of the oriented polymer fiber increase as the concentration of the polymer solution increases. In addition, serious fiber agglomeration during rapid solidification will also cause larger undulations. Thus, the concentration and the solidification speed of the organic polymer solution need to be controlled. Embodiments 1-2 and Comparative Example 1 illustrate that the concentration of the organic polymer solution needs to be controlled at 2-5 mg/ml. Embodiment 1, Embodiments 14-16, and Comparative Example 5 illustrate that the solidification speed needs to be controlled at 5-800 μm/s. Under these conditions, the organic semiconductor single crystal may be formed on the oriented polymer fiber.

Moreover, the concentration, the growth temperature of the crystal and the solvent selection for the organic semiconductor solution affect the nucleation rate and the crystal growth rate of the organic semiconductor; if the nucleation rate is too high and the solvent evaporates too quickly, the crystal growth may not keep up with the movement of the liquid membrane, increasing the tendency of the small-molecule organic semiconductor to form the polycrystal; if the nucleation rate is too low and the solvent evaporates too slowly, the uniform nucleation of the small-molecule organic semiconductor inside the solution may be caused, forming coarse crystals that are not in close contact with the underlying polymer fibers. Therefore, the concentration, the growth temperature of the crystal and the solvent for the organic semiconductor solution need to be controlled. Only under the combined action of the concentration of the solution being 0.2-0.8 mg/ml (Embodiments 1, 6, 9, 11 and Examples 2-4 and 6), the small-molecule organic semiconductor single crystal that closely adheres to the oriented polymer fiber may be obtained.

Figure 9:
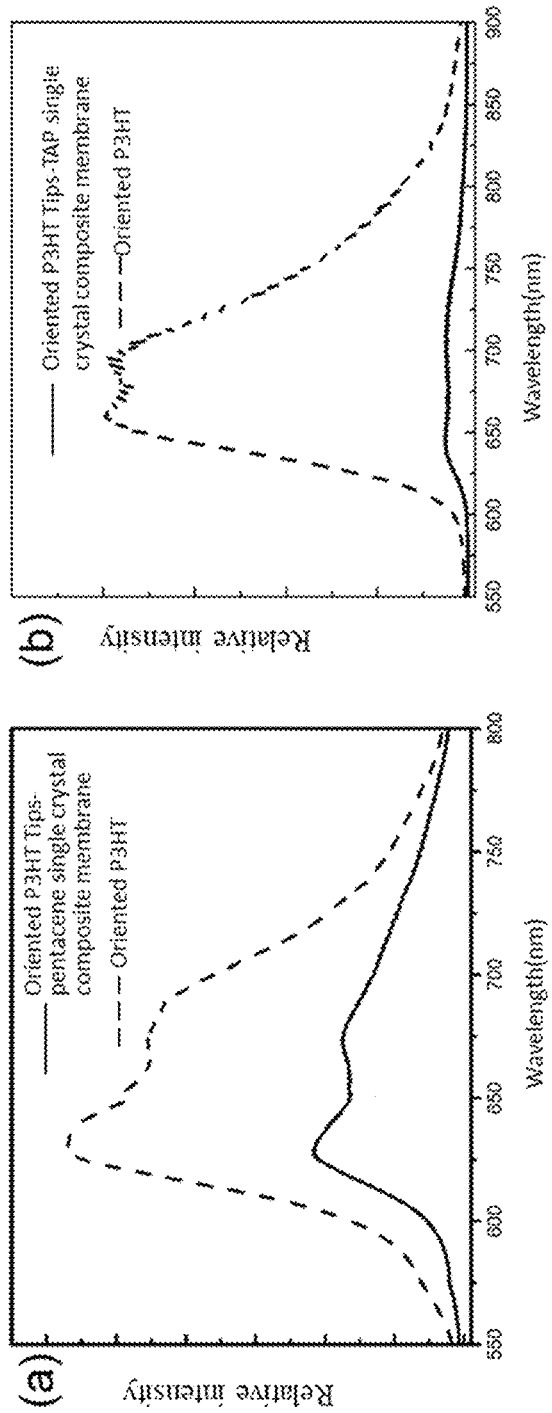
FIG. 9 shows a comparison of steady-state fluorescence performance of the optoelectronic device and the oriented P3HT fiber, wherein (a) is for Embodiment 1, and (b) is for Embodiment 6.

Using fluorescence spectrum to characterize the photophysical properties of the optoelectronic device may determine the ability of long-range ordering in photoelectric conversion. When the incident light irradiates the sample, photogenerated excitons are generated in the sample, one part of which may migrate to the heterojunction interface and dissociate into free carriers under the action of the built-in electric field, and the other part of which recombines before having time to migrate to the heterojunction interface to release photons again and be detected by the detector. Therefore, the fluorescence intensity of the composite system is detected to be attenuated in the steady-state fluorescence, indicating that compared with the single-component system, more photogenerated excitons are dissociated, i.e., the photoelectric conversion efficiency is higher (as shown in FIG. 9); the faster the fluorescence attenuation rate of the system is detected in transient fluorescence, the faster the migration rate of photogenerated excitons and the higher the dissociation efficiency, i.e., the higher the photoresponsiveness and photoelectric conversion efficiency. The fluorescence attenuation rate is defined by the fluorescence lifetime T, which may be obtained by exponential fitting of the transient fluorescence curve.

$$y = A_1 e^{\left(-\frac{t}{\tau_1}\right)} + A_2 e^{\left(-\frac{t}{\tau_2}\right)} + y_0 \qquad (2)$$

$$\tau = A_1 \tau_1 + A_2 \tau_2 \qquad (3)$$

Embodiments 1, 6, and Comparative Examples 7-10 explore the effects of different degrees of order of the composite membrane on the photophysical properties of the optoelectronic device. From FIG. 9, it can be seen that compared with the single-oriented P3HT fiber, Embodiments 1 and 6 both show obvious fluorescence quenching phenomenon, indicating that there is an effective charge transfer process in the long-range ordered composite membrane. From FIG. 10, it can be seen that as the long-range ordering of the composite membrane increases, the fluorescence lifetime shows an obvious attenuation trend (the fluorescence lifetime is 109 ps in Embodiment 1, the fluorescence lifetime is 150 ps in Comparative Example 7, and the fluorescence lifetime is 571 ps in Comparative Example 8; the fluorescence lifetime is 112 ps in Embodiment 6, the fluorescence lifetime is 154 ps in Comparative Example 9, and the fluorescence lifetime is 240 ps in Comparative Example 10), indicating that the improvement of the long-range ordering increases the diffusion distance and the carrier mobility of the excitons, thereby improving the photoelectric conversion capability of the composite membrane and realizing the preparation of high-performance optoelectronic devices.

The implementations of the present invention are described in detail above with reference to the accompanying drawings, but the invention is not limited to the above implementations. Even if various changes are made to the invention, if these changes fall within the scope of the claims of the invention and equivalent technologies, they will still fall within the protection scope of the invention.

What is claimed is:

1. An organic single crystal composite oriented polymer membrane, comprising an oriented polymer and an organic single crystal, wherein the oriented polymer is composed of polymer fibers in which organic polymers are arranged and grown in a single direction, the organic single crystal wraps the polymer fiber,
    wherein an organic semiconductor single crystal adheres to a surface of the polymer fiber for growth, wrapping the polymer fiber,
    wherein the surface micromorphology of the organic single crystal exhibits an undulation, and
    wherein a bonding surface between the organic single crystal and the oriented polymer exhibits an indentation.

2. The organic single crystal composite oriented polymer membrane according to claim 1, wherein an undulation for a surface micromorphology of the organic single crystal and an indentation on a bonding surface between the organic single crystal and the oriented polymer are observed to detect for wrapping.

3. The organic single crystal composite oriented polymer membrane according to claim 2, wherein a depth of the indentation on the bonding surface between the organic single crystal and the oriented polymer is measured for the wrapping, the depth of the indentation is a height difference between a lowest position of the indentation and an edge of the indentation, and 10 indentations on the bonding surface of the organic single crystal and the oriented polymer are randomly selected to measure an average depth of the indentations.

4. The organic single crystal composite oriented polymer membrane according to claim 3, wherein the depth of the indentation is greater than or equal to 5 nm.

5. The organic single crystal composite oriented polymer membrane according to claim 2, wherein a sample of the bonding surface between the organic single crystal and the oriented polymer is prepared by spin-coating a polyvinyl alcohol aqueous solution on an upper surface of the organic single crystal composite oriented polymer membrane at a rotation speed of 2000 rpm for 30 s, and peeling off the polyvinyl alcohol after drying to expose the bonding surface.

6. The organic single crystal composite oriented polymer membrane according to claim 1, wherein the organic semiconductor is selected from one or more of linear benzo compounds and derivatives thereof, linear heterobenzo compounds and derivatives thereof, benzothiophene compounds and derivatives thereof, perylene and derivatives thereof, and fullerene and derivatives thereof.

7. The organic single crystal composite oriented polymer membrane according to claim 1, wherein the organic semiconductor is 6,13-bis(triisopropylsilylethynyl) pentacene, 6,13-bis(triisopropylsilylethynyl)-5,7,12,14-tetraazapentacene, 2,7-dioctyl[1]benzothieno[3,2-b][1]benzothiophene, fullerene, or perylene.

8. The organic single crystal composite oriented polymer membrane according to claim 1, wherein the organic polymer is a linear conjugated homopolymer, a donor-acceptor alternating copolymer, or a polymer formed by polymerization of organic semiconductors with a molecular weight less than 10000.

9. The organic single crystal composite oriented polymer membrane according to claim 1, wherein the organic polymer is poly(3-hexylthiophene-2,5-diyl), PM6 or PY-IT.

10. The organic single crystal composite oriented polymer membrane according to claim 1, further comprising a substrate, wherein the polymer fibers are arranged and grown in a single direction on the substrate.

11. The organic single crystal composite oriented polymer membrane according to claim 10, wherein the substrate is glass, silicon wafer, metal oxide, polyimide, polyethylene terephthalate or mica wafer.

12. The organic single crystal composite oriented polymer membrane according to claim 10, wherein the substrate is a substrate modified with a self-assembled molecule containing a silane group, a self-assembled molecule containing a phosphate group or a self-assembled molecule containing a thiol group.

13. The organic single crystal composite oriented polymer membrane according to claim 10, wherein the substrate is a substrate modified by cross-linked polymethylmethacrylate or benzocyclobutene.

14. An optoelectronic device, comprising the organic single crystal composite oriented polymer membrane according to claim 1.

15. A preparation method for oriented polymer membrane, comprising steps of:
    A1: first preparing an organic polymer solution: dissolving an organic polymer in an organic solvent;
    A2: a spatial confinement and directional crystallization method: placing the substrate on a temperature gradient hot stage, wherein a temperature of an initial position of the substrate on the temperature gradient hot stage is between a melting point and a boiling point of the organic solvent;
    dropping the organic polymer solution on the substrate, and covering a preheated sheet-like member on solution droplets;
    before moving the substrate, bringing an item pre-cooled at a low temperature into contact with a surface of the sheet-like member on the side close to a low temperature zone of the temperature gradient hot stage so that a gradient of decreasing temperature is formed in a vertical direction from the substrate to the sheet-like member, nucleating and growing the organic solvent in a liquid membrane on a surface of the sheet-like member under low temperature induction, and removing the item pre-cooled at the low temperature once nucleation of the organic solvent is observed; and
    moving the substrate on the temperature gradient hot stage to a temperature area lower than the initial position while controlling a speed of moving the substrate,
    wherein the low temperature refers to a temperature at least 80° C. lower than the melting point of the organic solvent.

16. The preparation method for oriented polymer membrane according to claim 15, wherein the surface of the sheet-like member that contacts the organic polymer solution is modified with octadecyltrichlorosilane.

17. The preparation method for oriented polymer membrane according to claim 15, wherein in a process of moving the substrate, a weight greater than or equal to 100 g is used to hold down the sheet-like member.

18. The preparation method for oriented polymer membrane according to claim 15, wherein the speed of moving the substrate is 5-800 µm/s.

19. The preparation method for oriented polymer membrane according to claim 15, wherein the substrate is glass, silicon wafer, metal oxide, polyimide, polyethylene terephthalate or mica wafer.

20. The preparation method for oriented polymer membrane according to claim 15, wherein the organic solvent has the melting point lower than 30° C., and wherein the organic solvents undergo sublimation at or above 2 Pa vacuum under a temperature at or above −30° C., or are dissolved by a solvent under ambient condition.

21. The preparation method for oriented polymer membrane according to claim 20, wherein the organic solvent is a chlorinated aromatic hydrocarbon solvent.

22. The preparation method for oriented polymer membrane according to claim 21, wherein the organic solvent is 1,3,5-trichlorobenzene or 1,2,3-trichlorobenzene or 1,2,4,5-tetrachlorobenzene.

23. The preparation method for oriented polymer membrane according to claim 15, wherein the organic polymer is a linear conjugated homopolymer, a donor-acceptor alternating copolymer, or a polymer formed by polymerization of organic semiconductors with a molecular weight less than 10000.

24. The preparation method for oriented polymer membrane according to claim 15, wherein the organic polymer is poly(3-hexylthiophene-2,5-diyl), PM6 or PY-IT.

25. A preparation method for an organic single crystal composite oriented polymer membrane comprising an oriented polymer and an organic single crystal, wherein the oriented polymer is composed of polymer fibers in which organic polymers are arranged and grown in a single direction, and the organic single crystal wraps the polymer fiber, the method comprising steps of:
S1: preparing an oriented polymer membrane according to the preparation method for oriented polymer membrane according to claim 15; and
S2: growing an organic single crystal on the oriented polymer.

26. The preparation method for the organic single crystal composite oriented polymer membrane according to claim 25, wherein a concentration of the organic polymer solution is 0-5 mg/mL.

27. The preparation method for the organic single crystal composite oriented polymer membrane according to claim 26, wherein the concentration of the organic polymer solution is 2-4 mg/mL.

28. The preparation method for the organic single crystal composite oriented polymer membrane according to claim 25, wherein in the step S2, the organic single crystal is grown on the oriented polymer through a solution method.

29. The preparation method for the organic single crystal composite oriented polymer membrane according to claim 28, wherein in the growing the organic single crystal through a solution method comprises:
S201: first, dissolving an organic semiconductor in a solvent to prepare an organic semiconductor solution; and
S202: growing the organic single crystal on the oriented polymer by any one of a droplet-pinned crystallization method and a modification thereof and a meniscus coating method.

30. The preparation method for the organic single crystal composite oriented polymer membrane according to claim 29, wherein the growing the single crystal by a droplet-pinned crystallization method comprises:
S202: placing a substrate on which the oriented polymer has been prepared in a container and placing a pinnerat the center of the substrate on which the oriented polymer has been prepared, preheating the entire container, and dropping the organic semiconductor solution onto the pinner at the preheating temperature, so as to obtain the organic single crystal after the solvent in the droplet has completely evaporated.

31. The preparation method for the organic single crystal composite oriented polymer membrane according to claim 30, wherein the pinner is a silicon wafer, a needle or a metal rod.

32. The preparation method for the organic single crystal composite oriented polymer membrane according to claim 29, wherein the modification of the droplet-pinned crystallization method is placing the substrate on which the oriented polymer has been prepared in a container and tilting the substrate by 0.1-5°, preheating the entire container, and then dropping the organic semiconductor solution onto the pinner and sealing the container before half of a volume of the droplet is evaporated, so as to obtain the organic single crystal under preheating temperature conditions after the solvent in the droplet has completely evaporated.

33. The preparation method for the organic single crystal composite oriented polymer membrane according to claim 29, wherein the growing the organic single crystal by a meniscus coating method specifically comprises: adjusting a distance between a coating tool and the substrate on which the oriented polymer has been prepared to 100-150 µm, then preheating the substrate on which the oriented polymer has been prepared and injecting the organic semiconductor solution into a gap between the coating tool and the substrate at the preheating temperature, and then making the coating tool move parallel to the substrate at a constant speed to shear the organic semiconductor solution and absorbing the excess organic semiconductor solution after the coating is completed; or
dipping the substrate on which the oriented polymer has been prepared into the organic semiconductor solution, and lifting the substrate upward to form a meniscus between the lifted substrate and the organic semiconductor solution until the substrate is completely separated from the organic semiconductor solution.

34. The preparation method for the organic single crystal composite oriented polymer membrane according to claim 33, wherein the coating tool is a scraper, a blade, a smooth rod, a coil rod, a brush or a bead.

35. The preparation method for the organic single crystal composite oriented polymer membrane according to claim 33, wherein the coating tool moves at a speed of 10-800 µm/s.

36. The preparation method for the organic single crystal composite oriented polymer membrane according to claim 29, wherein in the step S201, a solubility of the organic semiconductor in the solvent is greater than 0.2 mg/mL, and the solvent does not dissolve the oriented polymer.

37. The preparation method for the organic single crystal composite oriented polymer membrane according to claim

36, wherein in the step S201, the solvent is n-hexane, n-heptane, m-xylene, 4-methyl-2-pentanone or a combination thereof.

38. The preparation method for the organic single crystal composite oriented polymer membrane according to claim 29, wherein a concentration of the organic semiconductor solution is 0.1-0.8 mg/mL.

* * * * *